US012119618B2

(12) United States Patent
Nakazawa et al.

(10) Patent No.: US 12,119,618 B2
(45) Date of Patent: Oct. 15, 2024

(54) NITRIDE-BASED SEMICONDUCTOR LIGHT-EMITTING ELEMENT AND MANUFACTURING METHOD THEREOF, AND MANUFACTURING METHOD OF NITRIDE-BASED SEMICONDUCTOR CRYSTAL

(71) Applicant: Nuvoton Technology Corporation Japan, Kyoto (JP)

(72) Inventors: Shuichi Nakazawa, Toyama (JP); Shinji Yoshida, Shiga (JP); Isao Kidoguchi, Hyogo (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 18/312,370

(22) Filed: May 4, 2023

(65) Prior Publication Data

US 2023/0275403 A1 Aug. 31, 2023

Related U.S. Application Data

(60) Division of application No. 17/122,856, filed on Dec. 15, 2020, now abandoned, which is a continuation of
(Continued)

(30) Foreign Application Priority Data

Dec. 11, 2018 (JP) .................. 2018-231997

(51) Int. Cl.
*H01S 5/22* (2006.01)
*H01L 21/02* (2006.01)
(Continued)

(52) U.S. Cl.
CPC .......... *H01S 5/2202* (2013.01); *H01S 5/2214* (2013.01); *H01S 5/34333* (2013.01);
(Continued)

(58) Field of Classification Search
CPC .......... H01L 21/02579; H01L 21/0254; H01S 5/34333; H01S 5/3063; H01S 2304/00–12
See application file for complete search history.

(56) References Cited

U.S. PATENT DOCUMENTS

| 5,909,040 A * | 6/1999 | Ohba | ..................... H01L 33/32 |
| | | | 257/190 |
| 5,932,896 A | 8/1999 | Sugiura et al. | |

(Continued)

FOREIGN PATENT DOCUMENTS

| CN | 101159306 A | | 4/2008 | |
| JP | 05183189 A | * | 7/1993 | ........... H01L 33/007 |

(Continued)

OTHER PUBLICATIONS

International Search Report and Written Opinion issued on Dec. 24, 2019 in International Application No. PCT/JP2019/046030; with partial English translation.
(Continued)

*Primary Examiner* — Joshua King
(74) *Attorney, Agent, or Firm* — Rimon P.C.

(57) ABSTRACT

A manufacturing method of a nitride-based semiconductor light-emitting element includes: forming an n-type nitride-based semiconductor layer; forming, on the n-type nitride-based semiconductor layer, a light emission layer including a nitride-based semiconductor; forming, on the light emission layer in an atmosphere containing a hydrogen gas, a p-type nitride-based semiconductor layer while doping the p-type nitride-based semiconductor layer with a p-type dopant at a concentration of at least $2.0\times10^{18}$ atom/cm$^3$; and annealing the p-type nitride-based semiconductor layer at a temperature of at least 800 degrees Celsius in an atmosphere not containing hydrogen. In this manufacturing method, a hydrogen concentration of the p-type nitride-based semiconductor layer after the annealing is at most $5.0\times10^{18}$ atom/
(Continued)

cm³ and at most 5% of the concentration of the p-type dopant, and a hydrogen concentration of the light emission layer is at most $2.0 \times 10^{17}$ atom/cm³.

22 Claims, 22 Drawing Sheets

Related U.S. Application Data application No. PCT/JP2019/046030, filed on Nov. 25, 2019.

(51) Int. Cl.
*H01S 5/042* (2006.01)
*H01S 5/20* (2006.01)
*H01S 5/30* (2006.01)
*H01S 5/32* (2006.01)
*H01S 5/343* (2006.01)

(52) U.S. Cl.
CPC .... *H01L 21/0254* (2013.01); *H01L 21/02576* (2013.01); *H01L 21/02579* (2013.01); *H01L 21/02581* (2013.01); *H01S 5/04253* (2019.08); *H01S 5/04257* (2019.08); *H01S 5/2009* (2013.01); *H01S 5/2031* (2013.01); *H01S 5/305* (2013.01); *H01S 5/3063* (2013.01); *H01S 5/3213* (2013.01); *H01S 2301/176* (2013.01); *H01S 2304/00* (2013.01)

(56) References Cited

U.S. PATENT DOCUMENTS

| | | | |
|---|---|---|---|
| 7,720,124 B2 | 5/2010 | Tamura et al. | |
| 7,764,721 B2 | 7/2010 | Chua et al. | |
| 2001/0017874 A1 | 8/2001 | Ishida | |
| 2002/0055274 A1* | 5/2002 | Takeya | H01L 21/3245 257/E21.326 |
| 2004/0166599 A1 | 8/2004 | Ishida | |
| 2004/0222524 A1 | 11/2004 | Song et al. | |
| 2004/0245540 A1 | 12/2004 | Hata et al. | |
| 2007/0057337 A1* | 3/2007 | Kano | B82Y 20/00 257/431 |
| 2007/0202621 A1* | 8/2007 | Komada | B82Y 20/00 438/22 |
| 2008/0073660 A1 | 3/2008 | Ohno et al. | |
| 2008/0151952 A1 | 6/2008 | Takatani et al. | |
| 2009/0227055 A1 | 9/2009 | Kusunoki et al. | |
| 2010/0289056 A1 | 11/2010 | Ohno et al. | |
| 2012/0112203 A1* | 5/2012 | Enya | H01L 21/0254 438/46 |
| 2013/0020551 A1 | 1/2013 | Yonemura et al. | |
| 2013/0044782 A1 | 2/2013 | Raring | |
| 2013/0234110 A1* | 9/2013 | Kato | H01L 33/14 438/47 |
| 2013/0270574 A1 | 10/2013 | Yokogawa et al. | |
| 2013/0285066 A1* | 10/2013 | Sumitomo | B82Y 20/00 438/45 |
| 2014/0048771 A1 | 2/2014 | Takahashi et al. | |
| 2014/0103289 A1 | 4/2014 | Liao et al. | |
| 2018/0277714 A1 | 9/2018 | Furusawa | |
| 2019/0305172 A1 | 10/2019 | Jain et al. | |

FOREIGN PATENT DOCUMENTS

| | | |
|---|---|---|
| JP | H10-135575 A | 5/1998 |
| JP | 2001-298214 A | 10/2001 |
| JP | 3682938 B2 | 8/2005 |
| JP | 2009-130316 A | 6/2009 |
| JP | 2010-067792 A | 3/2010 |
| JP | 2013-165094 A | 8/2013 |
| JP | 2014-183146 A | 9/2014 |
| JP | 6098259 B2 | 3/2017 |
| JP | 2018-125430 A | 8/2018 |
| WO | 2007/013257 A1 | 2/2007 |
| WO | 2012/053331 A1 | 4/2012 |
| WO | 2013/011722 A1 | 1/2013 |
| WO | WO-2014088030 A1 * | 6/2014 ............ B82Y 20/00 |
| WO | 2016/081555 A1 | 5/2016 |

OTHER PUBLICATIONS

Marvin J. Weber, "Handbook of Laser Wavelengths", 1999, CRC Press, 202-203. (Year: 1999).
Non-Final Office Action dated Jun. 24, 2022 issued in U.S. Appl. No. 17/122,856.
Final Office Action dated Jan. 13, 2023 issued in U.S. Appl. No. 17/122,856.

* cited by examiner

NITRIDE-BASED SEMICONDUCTOR LIGHT-EMITTING ELEMENT AND MANUFACTURING METHOD THEREOF, AND MANUFACTURING METHOD OF NITRIDE-BASED SEMICONDUCTOR CRYSTAL

CROSS REFERENCE TO RELATED APPLICATIONS

This application is a Divisional of U.S. patent application Ser. No. 17/122,856, filed on Dec. 15, 2020, which is a Continuation of PCT International Application No. PCT/JP2019/046030 filed on Nov. 25, 2019, designating the United States of America, which is based on and claims priority of Japanese Patent Application No. 2018-231997 filed on Dec. 11, 2018. The entire disclosures of the above-identified applications, including the specifications, drawings and claims are incorporated herein by reference in their entirety.

FIELD

The present disclosure relates to a nitride-based semiconductor light-emitting element and a manufacturing method thereof, and a manufacturing method of a nitride-based semiconductor crystal.

BACKGROUND

Semiconductor light-emitting elements formed using gallium nitride (GaN) are conventionally known. For example, Patent Literature (PTL) 1 discloses a manufacturing method of a semiconductor light-emitting element including forming a p-type layer by growing a nitride-based semiconductor material in an atmosphere not containing a hydrogen gas.

The p-type layer formed using the nitride-based semiconductor material is doped with a p-type dopant such as magnesium (Mg). When hydrogen is present in the p-type layer, hydrogen combines with Mg and causes loss of the activity of Mg as an acceptor, thus resulting in high resistance. In addition, excess hydrogen included in the semiconductor light-emitting element is considered to be the cause of deterioration in reliability of the semiconductor light-emitting element.

With the manufacturing method disclosed in PTL 1, since the p-type layer is formed in an atmosphere not containing a hydrogen gas, it is possible to keep the hydrogen concentration low in the p-type layer, thereby inhibiting the resistance of the p-type layer from becoming high. As a result, degradation of the element characteristics can be inhibited, thus realizing a long-life semiconductor element.

CITATION LIST

Patent Literature

PTL 1: Japanese Unexamined Patent Application Publication No. 2001-298214

SUMMARY

Technical Problem

With the above conventional manufacturing method of a semiconductor light-emitting element, however, the hydrogen's property of reducing and removing impurities cannot be obtained since nitride-based semiconductor films are grown in an atmosphere not containing a hydrogen gas. Thus, degradation of the crystallinity of the nitride-based semiconductor films formed occurs, and, as a result, a decrease in the light emission efficiency and slow degradation of light output are likely to occur.

Moreover, in the case of growing nitride-based semiconductor films in an atmosphere containing a nitrogen gas instead of a hydrogen gas, unneeded nitrogen cannot be easily released from the crystals, and thus, three-dimensional growth mode is likely to occur. Consequently, the grown nitride-based semiconductor film has an unfavorable surface condition.

Accordingly, the conventional technique does not realize a reliable semiconductor light-emitting element.

In view of the above, the present disclosure provides a reliable nitride-based semiconductor light-emitting element and a manufacturing method thereof, and a manufacturing method of a reliable nitride-based semiconductor crystal.

Solution to Problem

To address the above-described problem, a manufacturing method of a nitride-based semiconductor light-emitting element according to an aspect of the present disclosure includes: forming an n-type nitride-based semiconductor layer; forming, on the n-type nitride-based semiconductor layer, a light emission layer including a nitride-based semiconductor; forming, on the light emission layer in an atmosphere containing a hydrogen gas, a p-type nitride-based semiconductor layer while doping the p-type nitride-based semiconductor layer with a p-type dopant at a concentration of at least $2.0 \times 10^{18}$ atom/cm$^3$; and annealing the p-type nitride-based semiconductor layer at a temperature of at least 800 degrees Celsius in an atmosphere not containing hydrogen. In the above-described manufacturing method, a hydrogen concentration of the p-type nitride-based semiconductor layer after the annealing is at most $5.0 \times 10^{18}$ atom/cm$^3$ and at most 5% of the concentration of the p-type dopant, and a hydrogen concentration of the light emission layer is at most $2.0 \times 10^{17}$ atom/cm$^3$.

Note that in this Description, a nitride-based semiconductor layer including a nitride-based semiconductor crystal doped with a p-type dopant is referred to as a p-type nitride-based semiconductor layer (or a p-type nitride-based semiconductor crystal) even when the resistance is high due to hydrogen contained, for the sake of convenience. An atmosphere not containing hydrogen is, not only an atmosphere not containing a hydrogen gas, but also an atmosphere not containing a nitrogen hydride such as ammonia.

A manufacturing method of a nitride-based semiconductor crystal according to an aspect of the present disclosure includes: forming, in an atmosphere containing a hydrogen gas, a p-type nitride-based semiconductor crystal while doping the p-type nitride-based semiconductor layer with a p-type dopant at a concentration of at least $2.0 \times 10^{18}$ atom/cm$^3$; first annealing of annealing the p-type nitride-based semiconductor crystal at a temperature of at least 800 degrees Celsius in an inert gas atmosphere; and second annealing of annealing the p-type nitride-based semiconductor crystal at a temperature of at most 800 degrees Celsius in an oxidizing gas atmosphere after the first annealing. In the above-described manufacturing method, a hydrogen concentration of the p-type nitride-based semiconductor crystal after the second annealing is at most $5.0 \times 10^{18}$ atom/cm$^3$ and at most 5% of the concentration of the p-type dopant.

A nitride-based semiconductor light-emitting element according to an aspect of the present disclosure includes: an n-type nitride-based semiconductor layer; a light emission layer including a nitride-based semiconductor; and a p-type nitride-based semiconductor layer. In the above-described nitride-based semiconductor light-emitting element, the n-type nitride-based semiconductor layer, the light emission layer, and the p-type nitride-based semiconductor layer are laminated in sequence, a concentration of a p-type dopant of the p-type nitride-based semiconductor layer is at least $2.0 \times 10^{18}$ atom/cm$^3$, a hydrogen concentration of the p-type nitride-based semiconductor layer is at most $5.0 \times 10^{18}$ atom/cm$^3$ and at most 5% of the concentration of the p-type dopant, an oxygen concentration of the p-type nitride-based semiconductor layer is higher than an oxygen concentration of the light emission layer, and a hydrogen concentration of the light emission layer is at most $2.0 \times 10^{17}$ atom/cm$^3$.

A nitride-based semiconductor light-emitting element according to an aspect of the present disclosure includes: an n-type nitride-based semiconductor layer; a light emission layer including a nitride-based semiconductor; and a p-type nitride-based semiconductor layer. In the above-described nitride-based semiconductor light-emitting element, the n-type nitride-based semiconductor layer, the light emission layer, and the p-type nitride-based semiconductor layer are laminated in sequence, a concentration of a p-type dopant of the p-type nitride-based semiconductor layer is at least $2.0 \times 10^{18}$ atom/cm$^3$, and a hydrogen concentration of the p-type nitride-based semiconductor layer is at most $5.0 \times 10^{18}$ atom/cm$^3$ and at most 5% of the concentration of the p-type dopant. The above-described nitride-based semiconductor light-emitting element further includes an oxide selected from a group consisting of tantalum, vanadium, tin, indium, molybdenum, tungsten, niobium, titanium, cobalt, manganese, yttrium, and silicon, the oxide being provided on the p-type nitride-based semiconductor layer.

Advantageous Effects

According to the present disclosure, it is possible to provide a reliable nitride-based semiconductor light-emitting element and a manufacturing method thereof, and a manufacturing method of a reliable nitride-based semiconductor crystal.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Outline of the Present Disclosure

Figure 1:
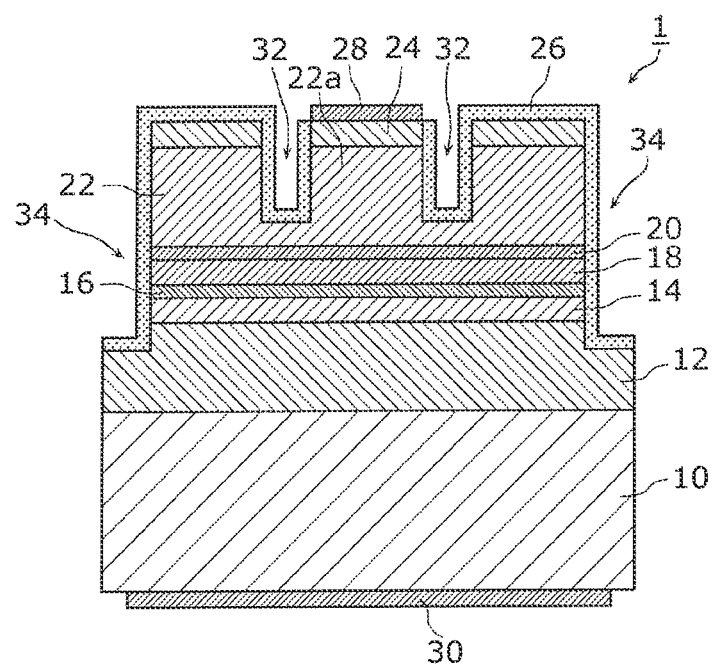
FIG. 1 is a cross-sectional view illustrating a configuration of a semiconductor laser element according to Embodiment 1.

To address the above-described problem, a manufacturing method of a nitride-based semiconductor light-emitting element according to an aspect of the present disclosure includes: forming an n-type nitride-based semiconductor layer; forming, on the n-type nitride-based semiconductor layer, a light emission layer including a nitride-based semiconductor; forming, on the light emission layer in an atmosphere containing a hydrogen gas, a p-type nitride-based semiconductor layer while doping the p-type nitride-based semiconductor layer with a p-type dopant at a concentration of at least $2.0 \times 10^{18}$ atom/cm$^3$; and annealing the p-type nitride-based semiconductor layer at a temperature of at least 800 degrees Celsius in an atmosphere not containing hydrogen. In the above-described manufacturing method, a hydrogen concentration of the p-type nitride-based semiconductor layer after the annealing is at most $5.0 \times 10^{18}$ atom/cm$^3$ and at most 5% of the concentration of the p-type dopant, and a hydrogen concentration of the light emission layer is at most $2.0 \times 10^{17}$ atom/cm$^3$.

Accordingly, since the p-type nitride-based semiconductor layer is formed in an atmosphere containing a hydrogen gas, it is possible to inhibit degradation of the crystallinity and surface condition of the p-type nitride-based semiconductor layer. By the annealing in an atmosphere not containing hydrogen, hydrogen contained in the p-type nitride-based semiconductor layer is decreased to at most $5.0 \times 10^{18}$ atom/cm$^3$ and at most 5% of the concentration of the p-type dopant. Thus, diffusion of hydrogen from the p-type nitride-based semiconductor layer to the light emission layer is inhibited, and the hydrogen concentration of the light emission layer becomes at most $2.0 \times 10^{17}$ atom/cm$^3$. Accordingly, since it is possible to inhibit occurrence of defects attributable to hydrogen in the light emission layer, a reliable nitride-based semiconductor light-emitting element can be realized.

For example, the annealing may include: first annealing of annealing the p-type nitride-based semiconductor layer at a temperature of at least 800 degrees Celsius in an inert gas atmosphere; and second annealing of annealing the p-type nitride-based semiconductor layer at a temperature of at most 800 degrees Celsius in an oxidizing gas atmosphere after the first annealing.

Accordingly, by performing two types of annealing, that is, one in an inert gas atmosphere and another in an oxidizing gas atmosphere, it is possible to sufficiently decrease the hydrogen concentration of the p-type nitride-based semiconductor layer without increasing the annealing temperature more than necessary. This makes it possible to realize a reliable nitride-based semiconductor light-emitting element having less damage to the nitride-based semiconductor layers from annealing. When the annealing temperature is too high, there is a risk of deterioration of the contact resistance due to release of nitrogen in the vicinity of the surface of the p-type nitride-based semiconductor layer. To address this, the annealing temperature of annealing in an inert gas atmosphere is set to at most 900 degrees Celsius, for example. By doing so, it is possible to inhibit an increase in the contact resistance between the p-type nitride-based semiconductor layer and a p-side electrode.

For example, the inert gas atmosphere may be an atmosphere containing a nitrogen gas, and the oxidizing gas atmosphere may be an atmosphere containing an oxygen gas.

Accordingly, a nitrogen gas atmosphere enables inhibition of release of nitrogen from the nitride-based semiconductor layers, and use of an oxygen gas enables efficient desorption of hydrogen from the nitride-based semiconductor layers by oxidation reaction. In addition, since gases that are not rare, such as a nitrogen gas and an oxygen gas, are used, a reliable nitride-based semiconductor light-emitting element can be readily realized at low cost.

For example, the manufacturing method of a nitride-based semiconductor light-emitting element according to an aspect of the present disclosure may further include forming a ridge by removing part of the p-type nitride-based semiconductor layer. In the above-described manufacturing method, the forming of the ridge may be performed after the first annealing, before the second annealing.

Accordingly, it is possible to form a semiconductor laser element having a ridge structure, for example. By performing annealing after forming a ridge, it is possible to relax residual stress generated at the time of forming the ridge.

For example, the manufacturing method of a nitride-based semiconductor light-emitting element according to an aspect of the present disclosure may further include forming a ridge by removing part of the p-type nitride-based semiconductor layer.

Accordingly, it is possible to form a semiconductor laser element having a ridge structure, for example.

For example, the forming of the ridge may be performed before the annealing.

Accordingly, by performing annealing after forming a ridge, it is possible to relax residual stress generated at the time of forming the ridge. In addition, by oxidizing the lateral surfaces of the ridge, it is possible to inhibit waste current flowing in the lateral surfaces of the ridge and not contributing to light emission. By relaxing the stress and inhibiting the waste current flowing in the lateral surfaces of the ridge, the current-light output characteristics of the nitride-based semiconductor light-emitting element can be improved.

For example, the manufacturing method of a nitride-based semiconductor light-emitting element according to an aspect of the present disclosure may further include forming, on the p-type nitride-based semiconductor layer, an oxide selected from a group consisting of tantalum, vanadium, tin, indium, molybdenum, tungsten, niobium, titanium, cobalt, manganese, yttrium, and silicon.

Accordingly, it is possible to inhibit release of nitrogen from the p-type nitride-based semiconductor layer, thus enabling inhibition of degradation of the film quality of the p-type nitride-based semiconductor layer. Meanwhile, since hydrogen can be effectively desorbed from the p-type nitride-based semiconductor layer, it is possible to sufficiently decrease the hydrogen concentration of the p-type nitride-based semiconductor layer without having to increase the annealing temperature.

For example, the forming of the oxide may be performed before the annealing.

Accordingly, it is possible to inhibit release of nitrogen from the p-type nitride-based semiconductor layer, thus enabling inhibition of degradation of the film quality of the p-type nitride-based semiconductor layer.

For example, the forming of the p-type nitride-based semiconductor layer may be performed by metalorganic vapor-phase epitaxy.

Accordingly, it is possible to form a p-type nitride-based semiconductor layer which is excellent in the crystallinity and film quality.

A manufacturing method of a nitride-based semiconductor crystal according to an aspect of the present disclosure includes: forming, in an atmosphere containing a hydrogen gas, a p-type nitride-based semiconductor crystal while doping the p-type nitride-based semiconductor layer with a p-type dopant at a concentration of at least $2.0\times10^{18}$ atom/cm$^3$; first annealing of annealing the p-type nitride-based semiconductor crystal at a temperature of at least 800 degrees Celsius in an inert gas atmosphere; and second annealing of annealing the p-type nitride-based semiconductor crystal at a temperature of at most 800 degrees Celsius in an oxidizing gas atmosphere after the first annealing. In the above-described manufacturing method, a hydrogen concentration of the p-type nitride-based semiconductor crystal after the second annealing is at most $5.0\times10^{18}$ atom/cm$^3$ and at most 5% of the concentration of the p-type dopant.

Accordingly, since the p-type nitride-based semiconductor crystal is formed in an atmosphere containing a hydrogen gas, it is possible to inhibit degradation of the crystallinity and surface condition of the p-type nitride-based semiconductor crystal. Hydrogen contained in the p-type nitride-based semiconductor crystal is decreased to at most $5.0\times10^{18}$ atom/cm$^3$ and at most 5% of the concentration of the p-type dopant by annealing in an inert gas atmosphere and annealing in an oxidizing gas atmosphere. Thus, diffusion of hydrogen from the p-type nitride-based semiconductor crystal to another layer (for example, the light emission layer or a photoelectric conversion layer) is inhibited, thus enabling a decrease in the hydrogen concentration of the other layer. Accordingly, since it is possible to inhibit occurrence of defects attributable to hydrogen in the other layer, a reliable nitride-based semiconductor crystal can be realized.

For example, the inert gas atmosphere may be an atmosphere containing a nitrogen gas, and the oxidizing gas atmosphere may be an atmosphere containing an oxygen gas.

Accordingly, since gases that are not rare, such as a nitrogen gas and an oxygen gas, are used, a reliable nitride-based semiconductor crystal can be readily realized at low cost.

For example, the forming of the p-type nitride-based semiconductor crystal may be performed by metalorganic vapor-phase epitaxy.

Accordingly, it is possible to form a p-type nitride-based semiconductor crystal which is excellent in the crystallinity.

A nitride-based semiconductor light-emitting element according to an aspect of the present disclosure includes: an n-type nitride-based semiconductor layer; a light emission layer including a nitride-based semiconductor; and a p-type nitride-based semiconductor layer. In the above-described nitride-based semiconductor light-emitting element, the n-type nitride-based semiconductor layer, the light emission layer, and the p-type nitride-based semiconductor layer are laminated in sequence, a concentration of a p-type dopant of the p-type nitride-based semiconductor layer is at least $2.0\times10^{18}$ atom/cm$^3$, a hydrogen concentration of the p-type nitride-based semiconductor layer is at most $5.0\times10^{18}$ atom/cm$^3$ and at most 5% of the concentration of the p-type dopant, an oxygen concentration of the p-type nitride-based semiconductor layer is higher than an oxygen concentration of the light emission layer, and a hydrogen concentration of the light emission layer is at most $2.0\times10^{17}$ atom/cm$^3$.

Accordingly, since it is possible to decrease the hydrogen concentration of the light emission layer, occurrence of defects attributable to hydrogen in the light emission layer can be inhibited. Therefore, a reliable nitride-based semiconductor light-emitting element can be realized.

For example, the p-type nitride-based semiconductor layer may contain aluminum.

Accordingly, the effect of the light confinement to the light emission layer and guide layers can be enhanced. Therefore, when the nitride-based semiconductor light-emitting element is, for example, a semiconductor laser element, high-output laser light can be emitted.

For example, the nitride-based semiconductor light-emitting element according to an aspect of the present disclosure may further include an oxide selected from a group consisting of tantalum, vanadium, tin, indium, molybdenum, tungsten, niobium, titanium, cobalt, manganese, yttrium, and silicon, the oxide being provided on the p-type nitride-based semiconductor layer.

Accordingly, the oxide can inhibit leak current flowing from the p-side electrode to an n-side electrode. In addition, since it is possible to decrease the hydrogen concentration of the light emission layer, occurrence of defects attributable to hydrogen in the light emission layer can be inhibited. Since a metal oxide whose metallic element is more than tetravalent in particular is excellent in hydrogen absorption and permeation, it is possible to efficiently desorb hydrogen out of the nitride-based semiconductor layers.

A nitride-based semiconductor light-emitting element according to an aspect of the present disclosure may include: an n-type nitride-based semiconductor layer; a light emission layer including a nitride-based semiconductor; and a p-type nitride-based semiconductor layer. In the above-described nitride-based semiconductor light-emitting element, the n-type nitride-based semiconductor layer, the light emission layer, and the p-type nitride-based semiconductor layer may be laminated in sequence, a concentration of a p-type dopant of the p-type nitride-based semiconductor layer may be at least $2.0\times10^{18}$ atom/cm$^3$, and a hydrogen concentration of the p-type nitride-based semiconductor layer may be at most $5.0\times10^{18}$ atom/cm$^3$ and at most 5% of the concentration of the p-type dopant. The above-described nitride-based semiconductor light-emitting element may further include an oxide selected from a group consisting of tantalum, vanadium, tin, indium, molybdenum, tungsten, niobium, titanium, cobalt, manganese, yttrium, and silicon, the oxide being provided on the p-type nitride-based semiconductor layer.

Accordingly, since it is possible to decrease the hydrogen concentration of the light emission layer, occurrence of defects attributable to hydrogen in the light emission layer can be inhibited. Therefore, a reliable nitride-based semiconductor light-emitting element can be realized. Since a metal oxide whose metallic element is more than tetravalent in particular is excellent in hydrogen absorption and permeation, it is possible to efficiently desorb hydrogen out of the nitride-based semiconductor layers.

For example, a hydrogen concentration of the light emission layer may be at most $2.0 \times 10^{17}$ atom/cm$^3$.

Accordingly, since the hydrogen concentration of the light emission layer is at most $2.0 \times 10^{17}$ atom/cm$^3$, it is possible to inhibit occurrence of defects attributable to hydrogen in the light emission layer.

For example, the light emission layer may contain indium.

Accordingly, by adjusting the composition ratio of indium, it is possible to emit laser light having a desired oscillation wavelength.

For example, the nitride-based semiconductor light-emitting element according to an aspect of the present disclosure may further include an undoped nitride-based semiconductor layer provided between the light emission layer and the p-type nitride-based semiconductor layer.

With this, the p-type nitride-based semiconductor layer containing hydrogen can be located away from the light emission layer, and it is thus possible to decrease diffusion of hydrogen into the light emission layer. Therefore, a reliable nitride-based semiconductor light-emitting element can be realized. In addition, with this configuration, the effect of the light confinement to the light emission layer and guide layers can be enhanced. Therefore, when the nitride-based semiconductor light-emitting element is, for example, a semiconductor laser element, high-output laser light can be emitted.

Hereinafter, exemplary embodiments will be specifically described with reference to the accompanying drawings.

Note that the embodiments described below illustrate general or specific examples. The numerical values, shapes, materials, constituent elements, the arrangement and connection of the constituent elements, steps, the processing order of the steps, etc. illustrated in the embodiments below are mere examples, and are therefore not intended to limit the present disclosure. Among the constituent elements in the embodiments described below, those not recited in the independent claims will be described as optional constituent elements.

Note also that the drawings are represented schematically and are not necessarily precise illustrations. Thus, the scales of the drawings, for example, are not necessarily precise. In the drawings, essentially the same constituent elements share the same reference signs, and redundant descriptions will be omitted or simplified.

In this Description, terms indicating relationships between elements, terms indicating the shapes of elements, and value ranges do not have the meanings in the strict sense only, but also represent essentially equivalent meanings and value ranges, and include, for example, deviations of about a few percent.

Also, in this Description, the terms "upper" and "lower" do not indicate the up direction (vertically up) and the down direction (vertically down) in terms of the absolute spatial recognition, but are used as terms defined by a relative positional relationship based on the sequence of lamination in the laminated structure. In addition, the terms "upper", "above", and "lower" are used not only when a constituent element is present between two other constituent elements spaced apart from each other, but also when two constituent elements are disposed in close contact with each other.

Embodiment 1

First, a configuration of a nitride-based semiconductor device according to Embodiment 1 will be described with reference to FIG. 1. FIG. 1 is a cross-sectional view illustrating a configuration of semiconductor laser element 1 according to the present embodiment.

Semiconductor laser element 1 is an example of the nitride-based semiconductor device. Specifically, semiconductor laser element 1 is an example of a nitride-based semiconductor light-emitting element in which an n-type nitride-based semiconductor layer, a light emission layer including a nitride-based semiconductor, and a p-type nitride-based semiconductor layer are laminated in sequence. Note that in the present embodiment, the nitride-based semiconductor is a group III-V nitride-based semiconductor. For example, the nitride-based semiconductor is a semiconductor including GaN as the main component, such as GaN, AlGaN, and InGaN. Note that the nitride-based semiconductor may contain a small amount of a group-V element such as P or As.

The nitride-based semiconductor is made n-type by having an n-type dopant added thereto. The n-type dopant is silicon (Si), for example. The n-type dopant may be germanium (Ge) or oxygen (O).

The nitride-based semiconductor is made p-type by having a p-type dopant added thereto. The p-type dopant is magnesium (Mg), for example. The p-type dopant may be zinc (Zn) or beryllium (Be).

As illustrated in FIG. 1, semiconductor laser element 1 includes substrate 10, n-type clad layer 12, n-type guide layer 14, light emission layer 16, p-side guide layer 18, electron barrier layer 20, p-type clad layer 22, p-type contact layer 24, current block layer 26, p-side electrode 28, and n-side electrode 30. In the present embodiment, for convenience of explanation, the direction in which n-side electrode 30 is located with respect to light emission layer 16 is referred to as "lower (the lower layer side)", and the direction in which p-side electrode 28 (and a ridge) is located with respect to light emission layer 16 is referred to as "upper (the upper layer side)".

Semiconductor laser element 1 has a ridge structure. Specifically, as illustrated in FIG. 1, trenches 32 are provided for forming protrusion 22a of p-type clad layer 22. Trenches 32 penetrate through p-type contact layer 24 in the laminating direction (up-down direction), and form recesses that are recessed from the upper surface of p-type clad layer 22. Trenches 32 do not penetrate through p-type clad layer 22. Trenches 32 are formed at both sides of the ridge of semiconductor laser element 1 in an elongated manner in a direction in which the ridge extends (for example, along the depth of the sheet of FIG. 1).

Semiconductor laser element 1 also has element isolation trenches 34. Element isolation trenches 34 penetrate through p-type contact layer 24, p-type clad layer 22, electron barrier layer 20, p-side guide layer 18, light emission layer 16, and n-type guide layer 14 in the laminating direction, and form recesses that are recessed from the upper surface of n-type clad layer 12. Element isolation trenches 34 do not penetrate through n-type clad layer 12. Element isolation trenches 34 are formed in an elongated manner in the direction in which the ridge extends, with a pair of trenches 32 interposed in between. P-side electrode 28 is not provided between one trench 32 and one element isolation trench 34 nor between the other trench 32 and the other element isolation trench 34, but dummy ridges not contributing to light emission are provided. Element isolation trenches 34 may penetrate through n-type clad layer 12 to reach substrate 10. Element isolation trenches 34 need not be provided, and trenches 32 may function as the element isolation trenches. In addition, semiconductor laser element 1 need not have the ridge structure, and need not have trenches 32 nor element isolation trenches 34.

Note that semiconductor laser element 1 may include a pad electrode that is provided on p-side electrode 28 and covers current block layer 26 and p-side electrode 28. In addition, semiconductor laser element 1 may include an adhesion auxiliary layer for enhancing adhesion between the pad electrode and current block layer 26. The pad electrode is, for example, a metal film such as Au, and patterned into a predetermined shape. The adhesion auxiliary layer is, for example, a laminated film of Ti and Pt, and patterned into a predetermined shape.

Table 1 below shows an example of specific configurations and film forming conditions of main layers included in semiconductor laser element 1. The specific configuration of each layer is a mere example; the material, thickness, impurity concentration, number of layers, etc., may be varied as appropriate.

Note that in the present embodiment, the impurity concentration of a given layer is the average concentration of an impurity contained in the layer in the depth direction. For example, the hydrogen concentration, nitrogen concentration, and oxygen concentration of a given layer are respectively the average concentration of hydrogen, nitrogen, and oxygen contained in the layer in the depth direction.

N-type clad layer 12 is an example of the n-type nitride-based semiconductor layer. N-type clad layer 12 is provided between substrate 10 and n-type guide layer 14, in contact with each of substrate 10 and n-type guide layer 14. As illustrated in Table 1, n-type clad layer 12 is, for example, an AlGaN layer having a thickness of 3 µm. The composition ratio of Al is 2.6%, for example. Si, an example of the n-type dopant, is added to n-type clad layer 12. The impurity concentration of n-type clad layer 12 is lower than the impurity concentration of substrate 10, and is $5.0 \times 10^{17}$ cm$^{-3}$, for example.

N-type guide layer 14 is an example of the n-type nitride-based semiconductor layer. N-type guide layer 14 is provided between n-type clad layer 12 and light emission layer 16, in contact with each of n-type clad layer 12 and light emission layer 16. As illustrated in Table 1, n-type guide layer 14 is, for example, a GaN layer having a thickness of 127 nm. Si, an example of the n-type dopant, is added to n-type guide layer 14. The impurity concentration of n-type guide layer 14 is equivalent to the impurity concentration of n-type clad layer 12, lower than the impurity concentration of substrate 10, and is, for example, $5.0 \times 10^{17}$ cm$^{-3}$.

Light emission layer 16 is an example of a light emitter including a nitride-based semiconductor, and is a layer forming a light emitter of semiconductor laser element 1. Light emission layer 16 contains indium (In). Light emission layer 16 is provided between n-type guide layer 14 and p-side guide layer 18, in contact with each of n-type guide layer 14 and p-side guide layer 18.

In the present embodiment, light emission layer 16 has a multi quantum well structure. Specifically, light emission layer 16 includes a plurality of well layers and a plurality of barrier layers alternately laminated one by one. More specifically, as illustrated in Table 1, light emission layer 16 includes two well layers and three barrier layers. Each of the

TABLE 1

| | | Material | Thickness [nm] | Impurity concentration [atom/cm³] | Film forming conditions | |
|---|---|---|---|---|---|---|
| | | | | | Carrier gas | Temperature [° C.] |
| P-type contact layer 24 | | p⁺-GaN | 10 | $2.0 \times 10^{20}$ | H₂ | 970 |
| | | p-GaN | 50 | $2.0 \times 10^{19}$ | | |
| P-type clad layer 22 | | p-AlGaN | 409 | $1.0 \times 10^{19}$ | | |
| | | p-AlGaN | 250 | $2.0 \times 10^{18}$ | | |
| Electron barrier layer 20 | | p-AlGaN | 1 | $1.5 \times 10^{19}$ | | |
| | | p-AlGaN | 5 | $1.5 \times 10^{19}$ | | |
| P-side guide layer 18 | | GaN | 3 | $1.5 \times 10^{19}$ | H₂ | Increase from 850 to 970 |
| | | GaN | 6 | Undoped | | |
| | | InGaN | 40 | Undoped | | |
| Light emission layer 16 | Barrier layer | InGaN | 18 | Undoped | | 850 |
| | Well layer | InGaN | 7.5 | Undoped | | |
| | Barrier layer | InGaN | 19 | Undoped | | |
| | Well layer | InGaN | 7.5 | Undoped | | |
| | Barrier layer | InGaN | 92 | Undoped | | |
| N-type guide layer 14 | | GaN | 127 | $5.0 \times 10^{17}$ | H₂ | 1130 |
| N-type clad layer 12 | | AlGaN | 3000 | $5.0 \times 10^{17}$ | | |
| Substrate 10 | | GaN | 85000 | $1.4 \times 10^{18}$ | | |

Substrate 10 is an n-type nitride-based semiconductor substrate containing an n-type dopant. Substrate 10 is an n-type GaN substrate, for example. The thickness of substrate 10 is at least 50 µm and at most 150 µm, for example.

The n-type dopant contained in substrate 10 is Si, for example. As illustrated in Table 1, the impurity concentration of substrate 10, that is, the n-type dopant concentration (specifically, Si concentration) is $1.4 \times 10^{18}$ cm$^{-3}$, for example.

two well layers is an undoped InGaN layer having a thickness of 7.5 nm. The composition ratio of In in the well layers is adjusted to make the oscillation wavelength 405 nm, for example. Each of the three barrier layers is an undoped In$_{0.08}$Ga$_{0.92}$N layer, and the thickness thereof is different from one another as illustrated in Table 1.

While the details will be described later, the plurality of nitride-based semiconductor layers included in light emission layer 16 are formed in an atmosphere containing a hydrogen gas. Thus, light emission layer 16 contains hydrogen. The hydrogen concentration of light emission layer 16 is at most $2.0 \times 10^{17}$ atom/cm$^3$. In addition, oxygen is supplied to light emission layer 16 by annealing performed in an oxidizing gas atmosphere. The oxygen concentration of light emission layer 16 is lower than the oxygen concentration of p-type clad layer 22.

Note that light emission layer 16 may have a single quantum well structure. For example, light emission layer 16 may include one well layer and two barrier layers.

P-side guide layer 18 includes an example of the p-type nitride-based semiconductor layer laminated above the light emission layer and examples of an undoped nitride-based semiconductor layer provided between the light emission layer and the p-type nitride-based semiconductor layer. P-side guide layer 18 is provided between light emission layer 16 and electron barrier layer 20, in contact with each of light emission layer 16 and electron barrier layer 20. For example, p-side guide layer 18 has a laminated structure including an undoped InGaN layer having a thickness of 40 nm, an undoped GaN layer having a thickness of 6 nm, and a p-type GaN layer having a thickness of 3 nm as illustrated in Table 1.

The undoped InGaN layer and the undoped GaN layer are examples of the undoped nitride-based semiconductor layer. The composition ratio of In in the undoped InGaN layer is 0.3%, for example. The p-type GaN layer is an example of the p-type nitride-based semiconductor layer, and has Mg added thereto as a p-type dopant. The impurity concentration of the p-type GaN layer is higher than the impurity concentration of substrate 10, and is $1.50 \times 10^{19}$ cm$^{-3}$, for example.

Electron barrier layer 20 inhibits a leak, to p-type clad layer 22, of electrons injected from n-side electrode 30 to light emission layer 16. Specifically, electron barrier layer 20 blocks electrons that move from light emission layer 16 to p-side electrode 28. By providing electron barrier layer 20, electrons can be more efficiently injected to light emission layer 16, and the light emission efficiency can be enhanced. Electron barrier layer 20 is provided between p-side guide layer 18 and p-type clad layer 22, in contact with each of p-side guide layer 18 and p-type clad layer 22. For example, electron barrier layer 20 has a laminated structure including a plurality of p-type AlGaN layers as illustrated in Table 1. The plurality of p-type AlGaN layers are different from one another in thickness and composition ratio of Al. A p-type AlGaN layer in contact with p-side guide layer 18 (the lower layer side) has a thickness of 5 nm, and has a composition ratio of Al that gradually increases from 4% to 36% in the direction from p-side guide layer 18 to p-type clad layer 22. A p-type AlGaN layer in contact with p-type clad layer 22 (the upper layer side) has a thickness of 1 nm, and its composition ratio of Al is 36%. Mg is added to the two p-type AlGaN layers as a p-type dopant. The impurity concentration of the p-type AlGaN layers is equivalent to the impurity concentration of the p-type GaN layer of p-side guide layer 18, and is $1.5 \times 10^{19}$ cm$^{-3}$, for example.

P-type clad layer 22 is an example of the p-type nitride-based semiconductor layer laminated above the light emission layer. P-type clad layer 22 contains aluminum (Al). P-type clad layer 22 is provided between electron barrier layer 20 and p-type contact layer 24, in contact with each of electron barrier layer 20 and p-type contact layer 24. As illustrated in FIG. 1, p-type clad layer 22 includes protrusion 22a protruding in the direction from n-side electrode 30 to p-side electrode 28. Specifically, protrusion 22a is a portion of a ridge extending in the [1–100] direction of semiconductor laser element 1. The height of protrusion 22a is 680 nm, for example.

In the present embodiment, the p-type dopant concentration (specifically, Mg concentration) of p-type clad layer 22 is at least $2.0 \times 10^{18}$ atom/cm$^3$. With this, a highly concentrated carrier can be obtained, and favorable laser characteristics can be thus achieved. The hydrogen concentration of p-type clad layer 22 is at most $5.0 \times 10^{18}$ atom/cm$^3$. In the present embodiment, the hydrogen concentration of p-type clad layer 22 is at most 5% of the p-type dopant concentration of p-type clad layer 22. The oxygen concentration of p-type clad layer 22 is higher than the oxygen concentration of light emission layer 16. When p-type clad layer 22 includes a plurality of p-type nitride-based semiconductor layers, each of the plurality of p-type nitride-based semiconductor layers has concentrations of Mg, hydrogen, and oxygen having the relationship described above.

Specifically, the Mg concentration of each of the plurality of p-type AlGaN layers included in p-type clad layer 22 is at least $2.0 \times 10^{18}$ atom/cm$^3$. The hydrogen concentration of each of the plurality of p-type AlGaN layers included in p-type clad layer 22 is at most $5.0 \times 10^{18}$ atom/cm$^3$ and at most 5% of the p-type dopant concentration. The oxygen concentration of each of the plurality of p-type AlGaN layers included in p-type clad layer 22 is higher than the oxygen concentration of each of the plurality of nitride-based semiconductor layers included in light emission layer 16.

For example, p-type clad layer 22 has a laminated structure including a plurality of p-type AlGaN layers as illustrated in Table 1. The plurality of p-type AlGaN layers are different from one another in thickness and impurity concentration. The respective Al composition ratios of the plurality of p-type AlGaN layers are equal to one another, and are 2.6%, for example. The plurality of p-type AlGaN layers have Mg added thereto as a p-type dopant. The impurity concentration of a p-type AlGaN layer in contact with electron barrier layer 20 (the lower layer side) is lower than the impurity concentration of electron barrier layer 20, and is, for example, $2.0 \times 10^{18}$ cm$^{-3}$. The impurity concentration of a p-type AlGaN layer in contact with p-type contact layer 24 (the upper layer side) is higher than the impurity concentration of the p-type AlGaN layer in contact with electron barrier layer 20 and lower than the impurity concentration of electron barrier layer 20, and is, for example, $1.0 \times 10^{19}$ cm$^{-3}$. Note that, specifically, each of the plurality of p-type AlGaN layers has a superlattice structure of AlGaN/GaN.

P-type contact layer 24 is provided between p-type clad layer 22 and p-side electrode 28, in contact with each of p-type clad layer 22 and p-side electrode 28. In the present embodiment, p-type contact layer 24 is provided on protrusion 22a of p-type clad layer 22. In other words, p-type contact layer 24 is part of the ridge of semiconductor laser element 1.

For example, p-type contact layer 24 has a laminated structure including a plurality of p-type GaN layers as illustrated in Table 1. The plurality of p-type GaN layers are different from one another in thickness and impurity concentration. The plurality of p-type GaN layers have Mg added thereto as a p-type dopant. The impurity concentration of a p-type GaN layer in contact with p-type clad layer 22 (the lower layer side) is higher than the impurity concentration of p-type clad layer 22, and is, for example, $2.0 \times 10^{19}$ atom/cm$^{-3}$. The impurity concentration of a p-type GaN layer in contact with p-side electrode 28 (the upper layer side) is higher than the impurity concentration of p-type clad layer 22, and is, for example, $2.0 \times 10^{20}$ atom/cm$^{-3}$. That is to say, the p-type GaN layer in contact with p-side electrode 28 is doped with the p-type dopant at high concentration.

Current block layer 26 is an example of an oxide provided on the p-type nitride-based semiconductor layer. Specifically, the oxide is an oxide selected from a group consisting of tantalum, vanadium, tin, indium, molybdenum, tungsten, niobium, titanium, cobalt, manganese, yttrium, and silicon. Current block layer 26 may include an oxide selected from this group.

Current block layer 26 constricts current flowing from p-side electrode 28 to n-side electrode 30. For example, current block layer 26 is located between p-type clad layer 22 and a pad electrode (not illustrated) provided on p-side electrode 28, and constricts current flowing from the pad electrode toward n-side electrode 30. As illustrated in FIG. 1, current block layer 26 is provided on the lateral sides of the ridge of semiconductor laser element 1. Specifically, current block layer 26 covers the lateral surfaces of protrusion 22a of p-type clad layer 22 and the upper surface of p-type clad layer 22 other than the upper surface of protrusion 22a. For example, in plan view, current block layer 26 is provided in a region other than the region in which p-side electrode 28 is provided. Note that a plan view is a view from a direction orthogonal to a principal surface of substrate 10 (for example, the (0001) plane of the GaN crystal structure). Current block layer 26 is formed using an electrical insulating material. For example, current block layer 26 is a silicon oxide film having a thickness of 300 nm.

P-side electrode 28 is provided in contact with p-type contact layer 24. P-side electrode 28 is formed using a metal material. For example, p-side electrode 28 has a laminated structure including a Pd film having a thickness of 40 nm and a Pt film having a thickness of 35 nm. The Pd film is located on the lower layer side, and is in contact with p-type contact layer 24.

N-side electrode 30 is provided on the lower surface of substrate 10 (that is, on the surface of substrate 10 opposite the surface on which n-type clad layer 12 is provided). N-side electrode 30 is formed using a metal material. Specifically, n-side electrode 30 includes at least one type of metal selected from a group consisting of Ti, Al, Pt, Au, Mo, Sn, In, Ni, Cr, Nb, Ba, Ag, Rh, Ir, Ru, and Hf, or an alloy of at least two types of metal selected from this group. For example, n-side electrode 30 has a laminated structure including an Au film having a thickness of 300 nm, a Pt film having a thickness of 35 nm, and a Ti film having a thickness of 10 nm. The Ti film is located on the upper layer side, and is in contact with substrate 10.

Semiconductor laser element 1 having the above configuration emits laser light having an oscillation wavelength of 405 nm (blue-violet), for example. Note that by changing the configuration of light emission layer 16 (the composition ratio of In, for example), semiconductor laser element 1 may emit laser light having an oscillation wavelength of 455 nm (blue light).

Next, a manufacturing method of semiconductor laser element 1 according to the present embodiment will be described with reference to FIG. 2 and FIG. 3A to FIG. 3F.

Figure 2:
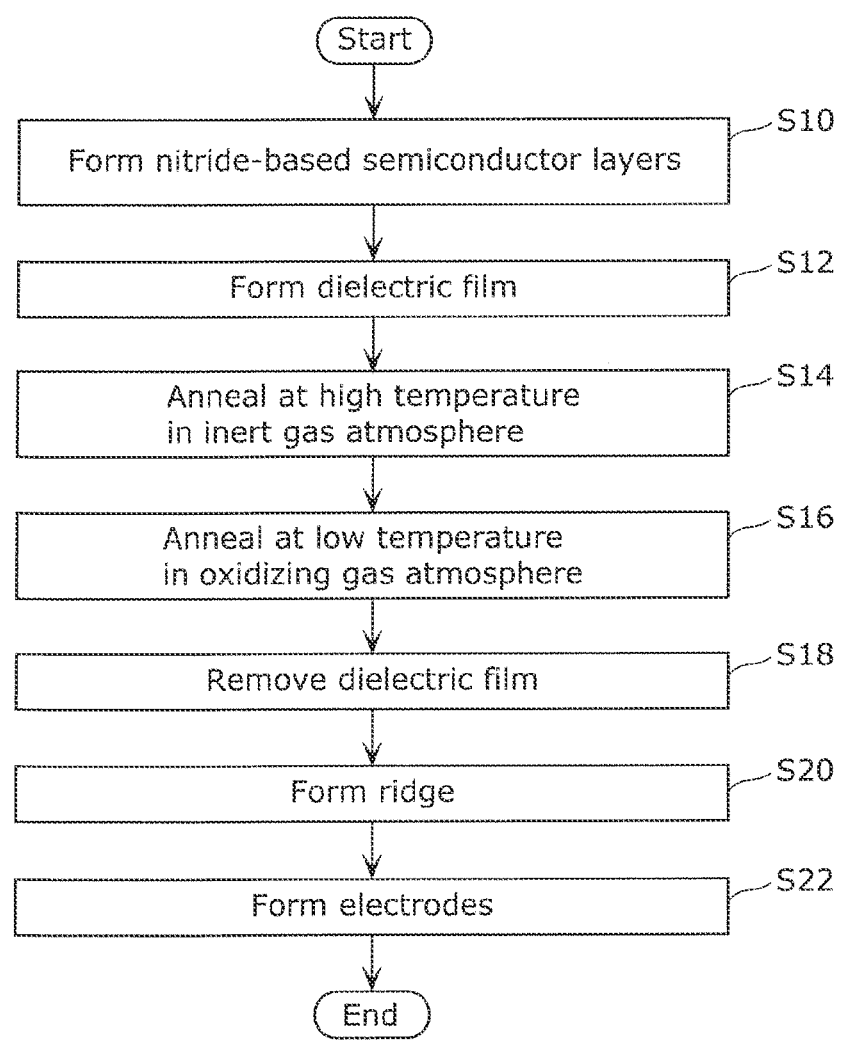
FIG. 2 is a flowchart illustrating a manufacturing method of a semiconductor laser element according to Embodiment 1.

FIG. 2 is a flowchart illustrating a manufacturing method of semiconductor laser element 1 according to the present embodiment. Each of FIG. 3A to FIG. 3F is a cross-sectional view illustrating processing included in the manufacturing method of semiconductor laser element 1 according to the present embodiment.

Figure 3A:
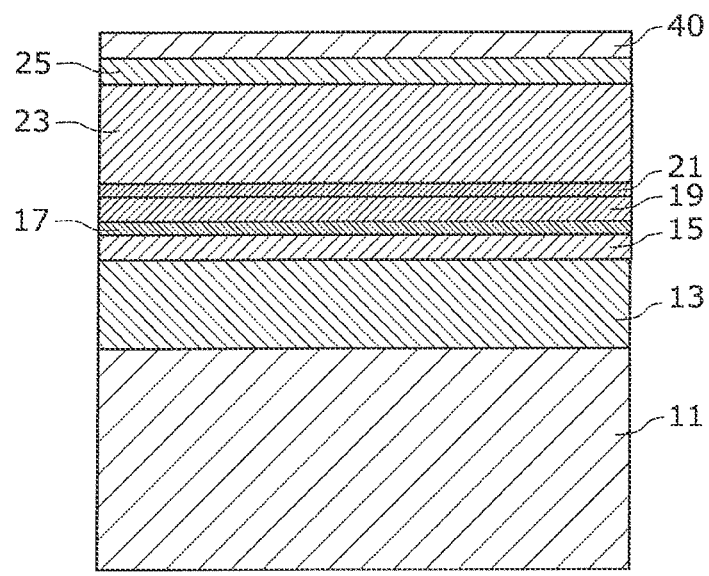
FIG. 3A is a cross-sectional view illustrating laminating of semiconductor layers included in the manufacturing method of the semiconductor laser element according to Embodiment 1.

First, as illustrated in FIG. 2, a plurality of nitride-based semiconductor layers are formed (S10). Specifically, as illustrated in FIG. 3A, a plurality of nitride-based semiconductor layers are formed on substrate 11 in sequence. The nitride-based semiconductor layers are formed by metalorganic vapor-phase epitaxy in which ammonia is used as a group-V raw material gas. With this, n-type first semiconductor layer 13, n-type second semiconductor layer 15, undoped third semiconductor layer 17, fourth semiconductor layer 19, fifth semiconductor layer 21 including a p-type nitride-based semiconductor crystal doped with a p-type dopant, sixth semiconductor layer 23 including a p-type nitride-based semiconductor crystal doped with a p-type dopant, and seventh semiconductor layer 25 including a p-type nitride-based semiconductor crystal doped with a p-type dopant are formed on substrate 11 in the stated sequence. First semiconductor layer 13, second semiconductor layer 15, third semiconductor layer 17, fourth semiconductor layer 19, fifth semiconductor layer 21, sixth semiconductor layer 23, and seventh semiconductor layer 25 become n-type clad layer 12, n-type guide layer 14, light emission layer 16, p-side guide layer 18, electron barrier layer 20, p-type clad layer 22, and p-type contact layer 24, respectively, by being patterned into predetermined shapes. Each semiconductor layer laminated may have a laminated structure of a plurality of semiconductor layers as illustrated in Table 1. Substrate 11 is an n-type nitride-based semiconductor substrate which is thicker than substrate 10 illustrated in FIG. 1. Substrate 11 becomes substrate 10 by having the lower surface polished in later processing.

Figure 4:
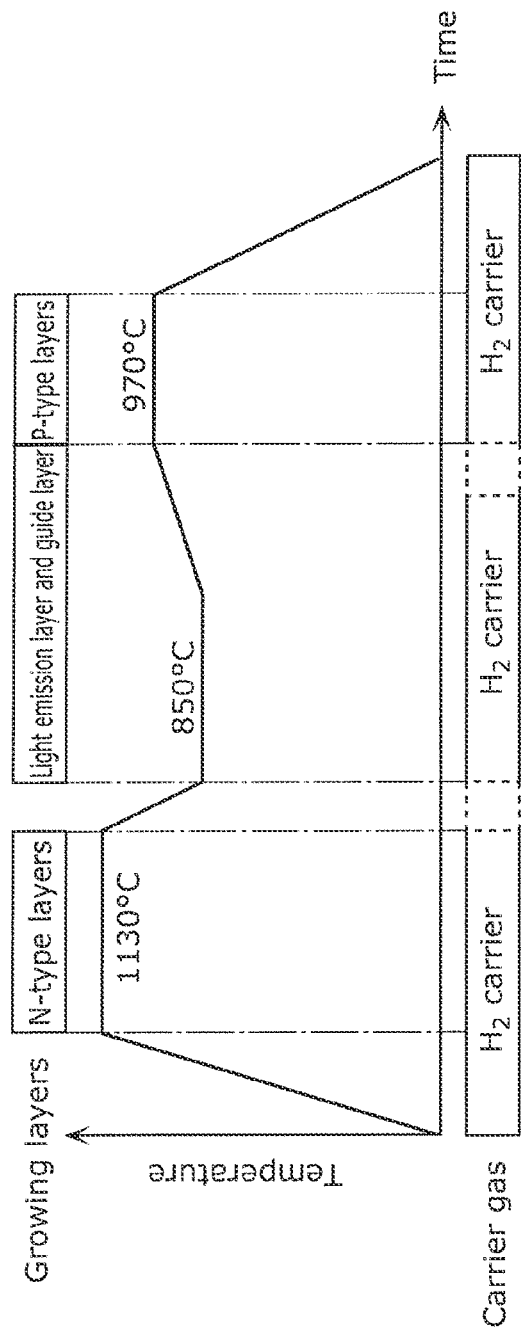
FIG. 4 is a graph showing a temperature profile in laminating of nitride-based semiconductor layers included in the manufacturing method of the semiconductor laser element according to Embodiment 1.

FIG. 4 is a graph showing a temperature profile in laminating of nitride-based semiconductor layers included in the manufacturing method of semiconductor laser element 1 according to the present embodiment. In FIG. 4, the horizontal axis represents time, and the vertical axis represents the substrate temperature at the time of film formation. FIG. 4 also shows the types of semiconductor layers that are growing (growing layers) and the carrier gas in association with time.

As illustrated in FIG. 4, forming the nitride-based semiconductor layers includes forming an n-type nitride-based semiconductor layer, forming, on the n-type nitride-based semiconductor layer, light emission layer 16 including a nitride-based semiconductor, and forming a p-type nitride-based semiconductor layer on light emission layer 16. The p-type nitride-based semiconductor layer is formed in an atmosphere containing a hydrogen gas while doping the p-type nitride-based semiconductor layer with a p-type dopant at a concentration of at least $2.0 \times 10^{18}$ atom/cm$^3$.

Specifically, as illustrated in FIG. 4, first, the substrate temperature is increased to 1130 degrees Celsius, and then n-type nitride-based semiconductor layers are formed on substrate 11. The n-type nitride-based semiconductor layers are, specifically, first semiconductor layer 13 and second semiconductor layer 15. That is to say, as illustrated in Table 1, an AlGaN film included in n-type clad layer 12 and a GaN film included in n-type guide layer 14 are grown at the temperature of 1130 degrees Celsius in an atmosphere containing a hydrogen gas.

After the n-type nitride-based semiconductor layers are formed, the substrate temperature is decreased to 850 degrees Celsius. In this period, the flow rate of the carrier gas is adjusted. The forming of the semiconductor layers is suspended while the substrate temperature is decreasing.

Next, a light emission layer and a guide layer are formed in sequence. Specifically, third semiconductor layer 17 and fourth semiconductor layer 19 are grown. More specifically, a plurality of undoped InGaN films are grown in sequence while adjusting the composition ratio of In as illustrated in Table 1. After five InGaN films included in light emission layer 16 are grown, the substrate temperature starts to be increased at timing when the InGaN film of p-side guide layer 18 starts to be grown. While the substrate temperature is gradually increased, the undoped InGaN film, the undoped GaN film, and the p-type GaN film that are included in p-side guide layer 18 are formed in sequence.

Next, the p-type nitride-based semiconductor layers are formed in an atmosphere containing a hydrogen gas. The p-type nitride-based semiconductor layers are, specifically, fifth semiconductor layer 21, sixth semiconductor layer 23, and seventh semiconductor layer 25. That is to say, as illustrated in Table 1, two p-type AlGaN films included in electron barrier layer 20, two p-type AlGaN films included in p-type clad layer 22, and two p-type GaN films included in p-type contact layer 24 are grown in the stated sequence at the temperature of 970 degrees Celsius in an atmosphere containing a hydrogen gas. After the p-type nitride-based semiconductor layers are formed, the substrate temperature is decreased.

As described above, in the present embodiment, the p-type nitride-based semiconductor layers (specifically, electron barrier layer 20, p-type clad layer 22, and p-type contact layer 24) are formed in an atmosphere containing a hydrogen gas. This makes it possible to increase the crystallinity of the p-type nitride-based semiconductor layers. In addition, since no nitrogen gas is used as the carrier gas in growing the p-type nitride-based semiconductor layers, the three-dimensional growth mode is not likely to occur, and degradation of the surface condition can be inhibited.

Next, as illustrated in FIG. 2 and FIG. 3A, after the nitride-based semiconductor layers are formed, dielectric film 40 is formed on the nitride-based semiconductor layers (S12). Dielectric film 40 is, for example, an insulating film such as a silicon oxide film, and is formed by a plasma chemical vapor deposition (CVD) method etc. Dielectric film 40 is provided to inhibit release of nitrogen from the nitride-based semiconductor layers caused by annealing.

The thickness of dielectric film 40 is, for example, at least 50 nm and at most 300 nm, and is 200 nm, for instance. With dielectric film 40 having a thickness of at least 50 nm, it is possible to sufficiently inhibit release of nitrogen from the p-type nitride-based semiconductor layers. In addition, with dielectric film 40 having a thickness of at most 300 nm, it is possible to inhibit dielectric film 40 from hindering desorption of hydrogen from the p-type nitride-based semiconductor layers. It is also possible to inhibit diffusion of hydrogen included in dielectric film 40 itself into the p-type nitride-based semiconductor layers.

Next, as illustrated in FIG. 2, the p-type nitride-based semiconductor layers are annealed at a temperature of at least 800 degrees Celsius in an atmosphere not containing hydrogen (S14, first annealing). Specifically, the p-type nitride-based semiconductor layers are annealed at a temperature of at least 800 degrees Celsius in an inert gas atmosphere not containing hydrogen. The inert gas is a nitrogen gas, for example. By annealing p-type fifth semiconductor layer 21, p-type sixth semiconductor layer 23, and p-type seventh semiconductor layer 25 at a high temperature of at least 800 degrees Celsius, the concentration of hydrogen contained in each layer can be decreased. The annealing period of the first annealing is 20 minutes, for example. The flow rate of the nitrogen gas is 6 slm, for example.

Next, after the first annealing, the p-type nitride-based semiconductor layers are annealed at a temperature of at most 800 degrees Celsius in an oxidizing gas atmosphere not containing hydrogen (S16, second annealing). The oxidizing gas is an oxygen gas, for example. The heating temperature in the second annealing is lower than the heating temperature in the first annealing. By annealing p-type fifth semiconductor layer 21, p-type sixth semiconductor layer 23, and p-type seventh semiconductor layer 25 at a low temperature of at most 800 degrees Celsius, the concentration of hydrogen contained in each layer can be further decreased without oxidizing the surface of seventh semiconductor layer 25. The annealing period of the second annealing is shorter than the annealing period of the first annealing, and is 5 minutes, for example. The flow rate of the oxygen gas is, for example, 6 slm, which is the same as the gas flow rate in the first annealing.

Next, after the first annealing and the second annealing are both finished, dielectric film 40 is removed (S18). Dielectric film 40 is removed by dry etching or wet etching, or both.

After removing dielectric film 40, a ridge is formed by removing part of the plurality of nitride-based semiconductor layers (S20). Specifically, by removing part of the plurality of nitride-based semiconductor layers, trenches 32 and element isolation trenches 34 are formed. By forming trenches 32 and element isolation trenches 34, a ridge and dummy ridges of semiconductor laser element 1 are formed.

Figure 3B:
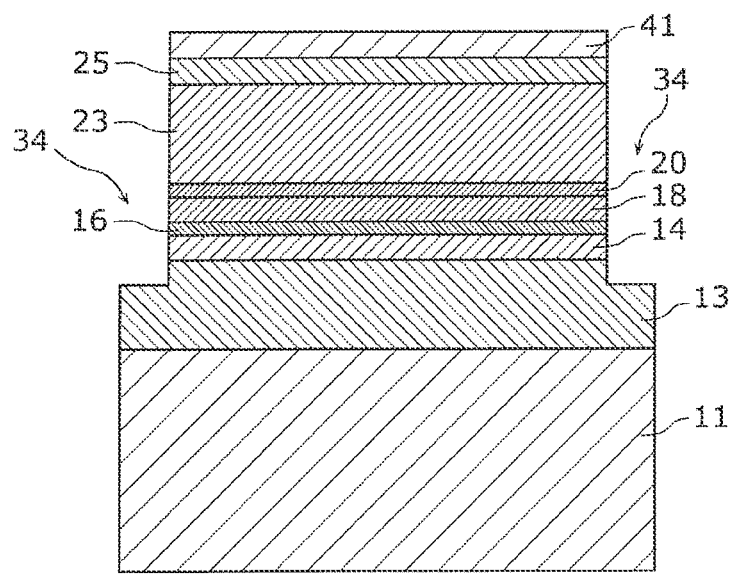
FIG. 3B is a cross-sectional view illustrating forming of element isolation trenches included in the manufacturing method of the semiconductor laser element according to Embodiment 1.

Specifically, first, element isolation trenches 34 are formed as illustrated in FIG. 3B. Specifically, element isolation trenches 34 are formed by forming a hard mask, etching the nitride-based semiconductor layers, and removing the hard mask in sequence. The hard mask is, for example, oxide film 41 having openings in positions at which element isolation trenches 34 are provided in plan view. Oxide film 41 is a silicon oxide film, for example. Oxide film 41 is formed by forming an oxide film, applying a photosensitive resist, performing photolithography, performing etching, and removing the resist in sequence. The etching for oxide film 41 is performed by, for example, dry etching which uses a fluorine-based gas including $CF_4$ and $CHF_3$, or wet etching which uses a hydrofluoric acid-based solution. Note that oxide film 41 may include dielectric film 40 used for protection at the time of annealing. In other words, the removing of dielectric film 40 may be omitted.

By performing the etching using oxide film 41 as a mask, part of the nitride-based semiconductor layers is removed, thereby forming element isolation trenches 34. The etching of the nitride-based semiconductor layers is performed by, for example, dry etching which uses a chlorine-based gas including $BCl_3$ and $Cl_2$. Specifically, the etching penetrates through seventh semiconductor layer 25 (p-type contact layer 24), sixth semiconductor layer 23 (p-type clad layer 22), fifth semiconductor layer 21 (electron barrier layer 20), fourth semiconductor layer 19 (p-side guide layer 18), third semiconductor layer 17 (light emission layer 16), and second semiconductor layer 15 (n-type guide layer 14) in sequence, and removes part of first semiconductor layer 13 (n-type clad layer 12). This way, element isolation trenches 34 are formed as illustrated in FIG. 3B. After element isolation trenches 34 are formed, oxide film 41 is removed.

Figure 3C:
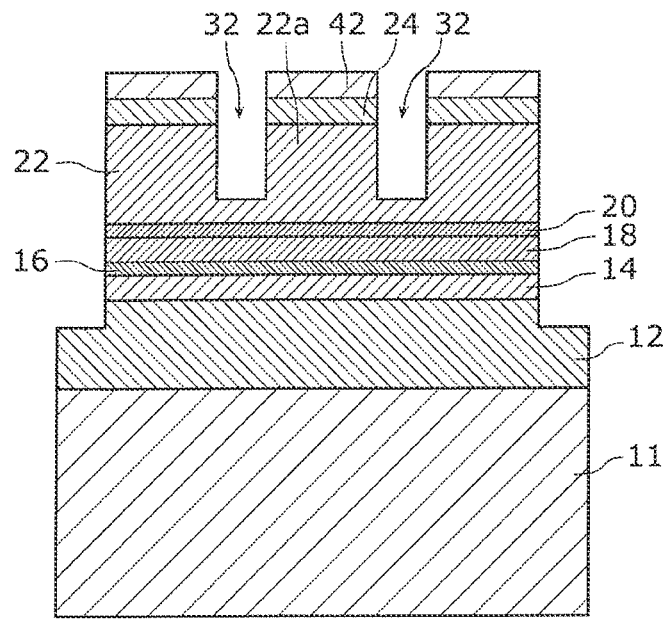
FIG. 3C is a cross-sectional view illustrating forming of a ridge included in the manufacturing method of the semiconductor laser element according to Embodiment 1.

Next, as illustrated in FIG. 3C, the ridge (and the dummy ridges) of semiconductor laser element 1 is formed by forming trenches 32. Specifically, in the same manner as element isolation trenches 34, trenches 32 are formed by forming a hard mask, etching the nitride-based semiconductor layers, and removing the hard mask in sequence. The hard mask is, for example, oxide film 42 having openings in positions at which trenches 32 are provided in an element region in plan view. Note that the element region is, in plan view, a region in which the light emitter of semiconductor laser element 1 is provided, and a region which is isolated by element isolation trenches 34. Oxide film 42 is a silicon oxide film, for example. Oxide film 42 is formed by forming an oxide film, applying a photosensitive resist, performing photolithography, performing etching, and removing the resist in sequence. Note that oxide film 42 may include dielectric film 40 used for protection at the time of annealing or oxide film 41 used as the hard mask at the time of forming element isolation trenches 34.

Specifically, by performing the etching using oxide film 42 as a mask, part of the nitride-based semiconductor layers is removed, thereby forming trenches 32. More specifically, the etching penetrates through seventh semiconductor layer 25 (p-type contact layer 24), and removes part of sixth semiconductor layer 23 (p-type clad layer 22). This way, protrusion 22a is formed in p-type clad layer 22, thereby forming the ridge of semiconductor laser element 1.

Figure 3D:
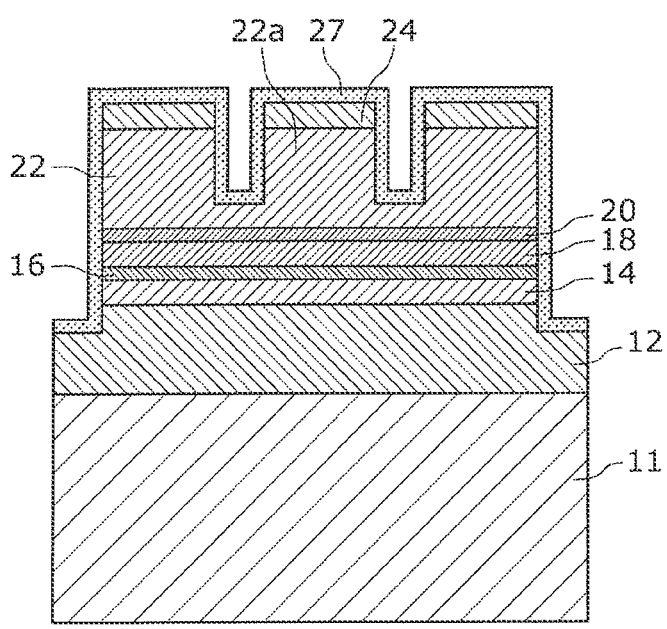
FIG. 3D is a cross-sectional view illustrating forming of a dielectric film included in the manufacturing method of the semiconductor laser element according to Embodiment 1.

Next, as illustrated in FIG. 2, p-side electrode 28 and n-side electrode 30 are formed in sequence (S22). Specifically, as illustrated in FIG. 3D, insulating film 27 is formed to cover the upper surface of p-type contact layer 24 and the surfaces of trenches 32 and element isolation trenches 34. Insulating film 27 is a silicon oxide film, for example, and is formed by a plasma CVD method etc.

Figure 3E:
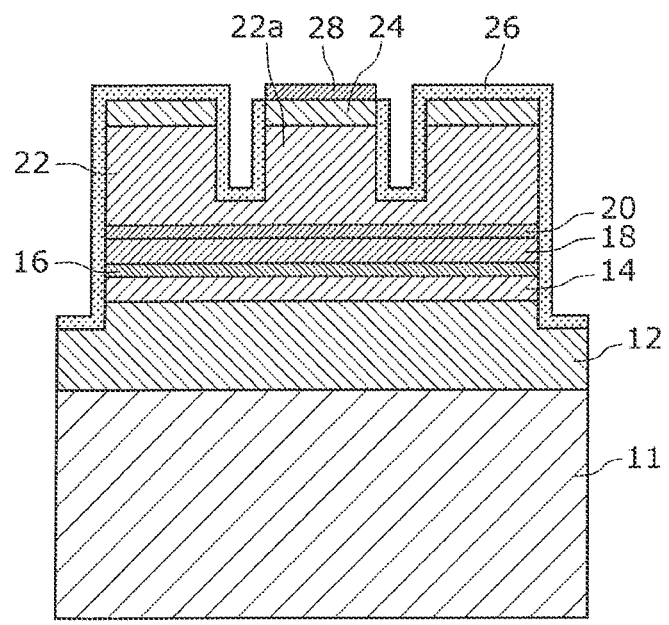
FIG. 3E is a cross-sectional view illustrating forming of a p-side electrode included in the manufacturing method of the semiconductor laser element according to Embodiment 1.

Next, by patterning insulating film 27, the upper surface of p-type contact layer 24 on protrusion 22a of p-type clad layer 22 is exposed to form p-side electrode 28. Insulating film 27 is patterned by applying a photosensitive resist, performing photolithography, and performing etching. By patterning insulating film 27, current block layer 26 is formed as illustrated in FIG. 3E. Note that insulating film 27 may include dielectric film 40 used for protection at the time of annealing or oxide film 41 or 42 used as the hard mask at the time of patterning the nitride-based semiconductor layers. That is to say, current block layer 26 may include, for example, dielectric film 40 used for protection at the time of annealing.

Next, p-side electrode 28 is formed on the exposed upper surface of p-type contact layer 24. Specifically, by applying a photosensitive resist and performing photolithography, a resist layer having an opening only in the upper portion of the ridge is formed. Next, a Pd film and a Pt film are formed in sequence on the resist layer formed. Metal films such as the Pd film and the Pt film are formed by, for example, a vapor deposition method or a sputtering method. After the metal films are formed, p-side electrode 28 is formed on p-type contact layer 24 by a lift-off method. Note that p-side electrode 28 may be formed by forming metal films on the entire surface and then patterning the metal films by etching, for example.

After p-side electrode 28 is formed, a pad electrode including a metal material such as Au may be formed on p-side electrode 28. An adhesion auxiliary layer that is a laminated layer including Ti and Pt may be formed between current block layer 26 and the pad electrode to increase adhesion of the pad electrode.

Figure 3F:
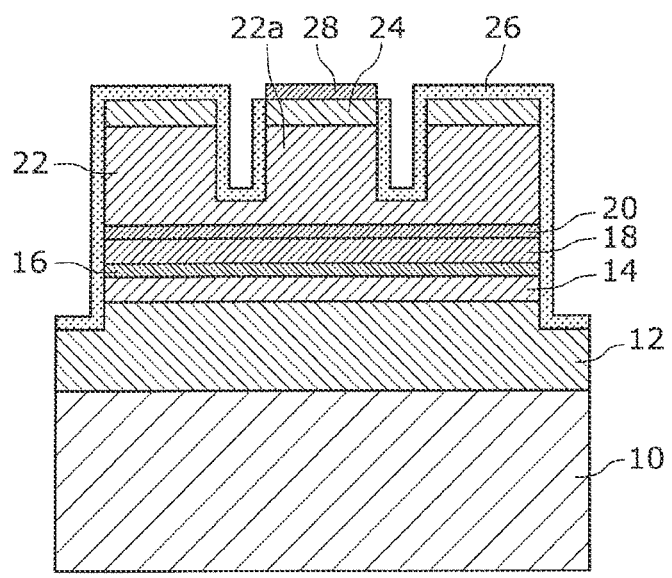
FIG. 3F is a cross-sectional view illustrating polishing of a substrate included in the manufacturing method of the semiconductor laser element according to Embodiment 1.

Next, substrate 11 is polished as illustrated in FIG. 3F. Polishing is performed by chemical mechanical polishing (CMP), for example. Through the polishing, the thickness of substrate 11 is decreased, thereby forming thinned substrate 10 as illustrated in FIG. 3F. After the polishing, an organic substance attached to the polished surface is removed through cleansing with an organic substance and ashing processing using oxygen plasma, and a damaged layer resulting from the polishing is removed by dry etching or wet etching. In the present embodiment, dry etching is performed using a chlorine-based gas to etch the polished surface by at least 200 nm, thereby removing the damaged layer resulting from the polishing.

Next, n-side electrode 30 is formed on the polished surface of substrate 10. N-side electrode 30 is formed by, for example, applying a photosensitive resist, performing photolithography, forming metal films, and patterning the metal films by a lift-off method, in sequence. The metal films are formed by, for example, vapor-depositing or sputtering a Ti film, a Pt film, and an Au film in the stated sequence.

With the above-described processing, semiconductor laser element 1 illustrated in FIG. 1 is manufactured.

The following describes impacts that the two annealing processes in the above manufacturing method have on the nitride-based semiconductor layers. First, impacts of the first annealing performed in an inert gas atmosphere (specifically, an $N_2$ gas atmosphere) will be described with reference to FIG. 5 to FIG. 8.

Figure 5:
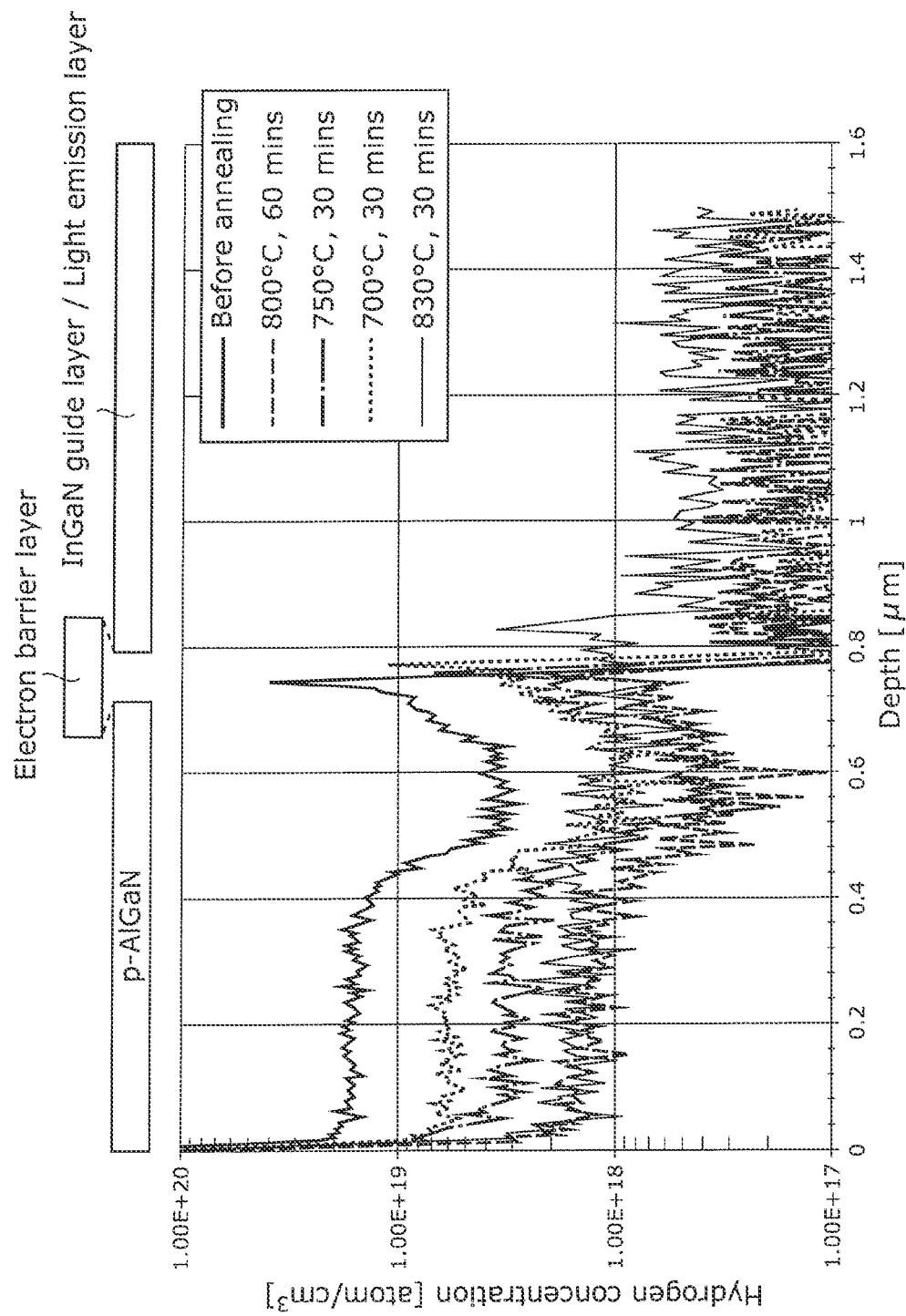
FIG. 5 is a graph showing hydrogen concentration distribution of the semiconductor laser element according to Embodiment 1, in the depth direction from a p-type clad layer to a light emission layer.

FIG. 5 is a graph showing temperature dependence of the hydrogen concentration of p-type clad layer 22 on the annealing temperature in an $N_2$ gas atmosphere, in semiconductor laser element 1 according to the present embodiment. In FIG. 5, the horizontal axis represents the depth from the upper surface of p-type contact layer 24. The vertical axis represents hydrogen concentration obtained by secondary ion mass spectrometry (SIMS) analysis.

When the SIMS analysis is performed in a state in which dielectric film 40 containing a large quantity of hydrogen is remaining, hydrogen released from the dielectric film is detected simultaneously with hydrogen in the semiconductor, thus decreasing the accuracy of the hydrogen concentration. For this reason, prior to the SIMS analysis, dielectric film 40 was removed by wet etching from the samples subjected to the SIMS analysis. Note that due to the characteristics of the SIMS analysis, the result of analysis of a region in the vicinity of the surface (ranging up to several tens of nanometers in depth, for example) may indicate an inaccurate value under the influence of noise etc, and thus, the hydrogen concentration of p-type contact layer 24, which is the outermost layer, may indicate an incorrect value. This also applies to the other SIMS analysis results illustrated in FIG. 9, FIG. 13, and FIG. 20.

The depth range from 0.05 μm to 0.45 μm corresponds to, of the two p-type AlGaN layers included in p-type clad layer 22, a p-type AlGaN layer located closer to p-type contact layer 24 (the upper layer side). The depth range from 0.45 μm to 0.70 μm corresponds to, of the two p-type AlGaN layers included in p-type clad layer 22, a p-type AlGaN layer located closer to electron barrier layer 20 (the lower layer side). The depth range from 0.70 μm to 0.80 μm corresponds to the two p-type AlGaN layers included in electron barrier layer 20 and the p-type GaN layer included in p-side guide layer 18. The depth range deeper than 0.80 μm corresponds to the InGaN layer of p-side guide layer 18 and light emission layer 16. These also apply to the other SIMS analysis results illustrated in FIG. 9, FIG. 13, and FIG. 20.

Hydrogen contained in the nitride-based semiconductor layers results from hydrogen contained in a gas introduced at the time of film formation. Specifically, hydrogen is taken into the crystals of the nitride-based semiconductor layers in proportion to the p-type dopant concentration. That is to say, a layer having a high p-type dopant concentration has a high hydrogen concentration. For example, as illustrated in Table 1, since the p-type dopant concentration of electron barrier layer 20 is higher than the p-type dopant concentration of p-type clad layer 22, the hydrogen concentration is high at the depth where electron barrier layer 20 is located, as illustrated in FIG. 5.

FIG. 5 illustrates the hydrogen concentrations before annealing in an $N_2$ gas atmosphere (hereinafter referred to as nitrogen annealing) and after nitrogen annealing at predetermined temperatures for predetermined periods. As illustrated in FIG. 5, the hydrogen concentration of p-type clad layer 22 is decreased by nitrogen annealing. The degree of hydrogen concentration decrease depends on the annealing temperature. For example, when nitrogen annealing is performed at 700 degrees Celsius for 30 minutes, the hydrogen concentration of p-type clad layer 22 is decreased approximately by half. When nitrogen annealing is performed at 800 degrees Celsius for 60 minutes and when nitrogen annealing is performed at 830 degrees Celsius for 30 minutes, the hydrogen concentration of p-type clad layer 22 is decreased approximately by one digit.

Figure 6:
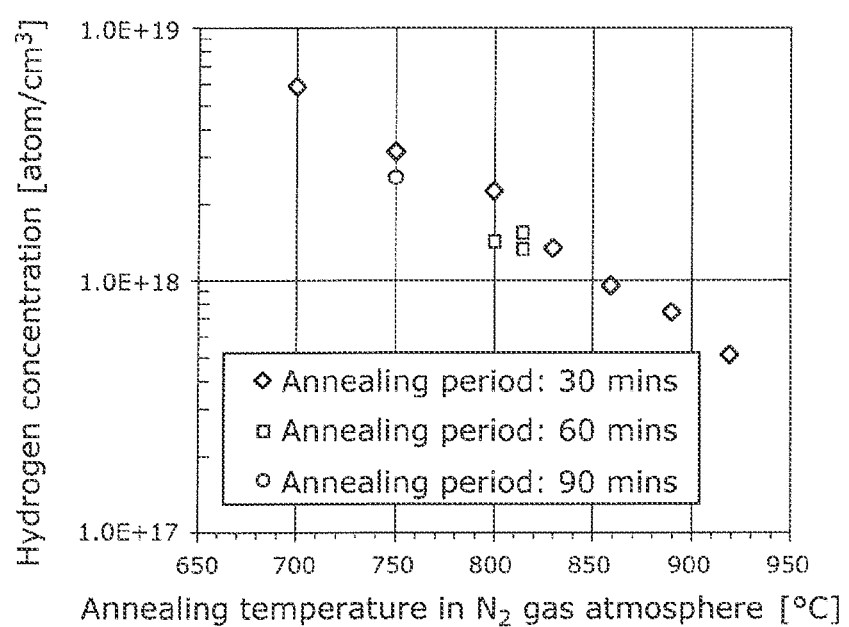
FIG. 6 is a graph showing temperature dependence of hydrogen concentration of the p-type clad layer on annealing temperature in an $N_2$ gas atmosphere, in the semiconductor laser element according to Embodiment 1.

Note that, although not illustrated in FIG. 5, nitrogen annealing at 815 degrees Celsius for 60 minutes achieved a hydrogen concentration decrease equivalent to a hydrogen concentration decrease achieved by nitrogen annealing at 830 degrees Celsius for 30 minutes as illustrated in FIG. 6. Also, nitrogen annealing at 750 degrees Celsius for 90 minutes achieved a hydrogen concentration decrease greater than a hydrogen concentration decrease achieved by nitrogen annealing at 750 degrees Celsius for 30 minutes. In other words, the hydrogen concentration can be decreased by increasing the nitrogen annealing period.

FIG. 6 is a graph showing temperature dependence of the hydrogen concentration of p-type clad layer 22 on the annealing temperature in an $N_2$ gas atmosphere, in semiconductor laser element 1 according to the present embodiment. In FIG. 6, the horizontal axis represents the annealing temperature of nitrogen annealing. The vertical axis represents the hydrogen concentration of, of the two p-type AlGaN layers included in p-type clad layer 22, a p-type AlGaN layer located closer to p-type contact layer 24 (the upper layer side).

As illustrated in FIG. 6, the hydrogen concentration can be decreased by increasing the annealing temperature of nitrogen annealing. In addition, the hydrogen concentration can be further decreased by increasing the annealing period.

Figure 7:
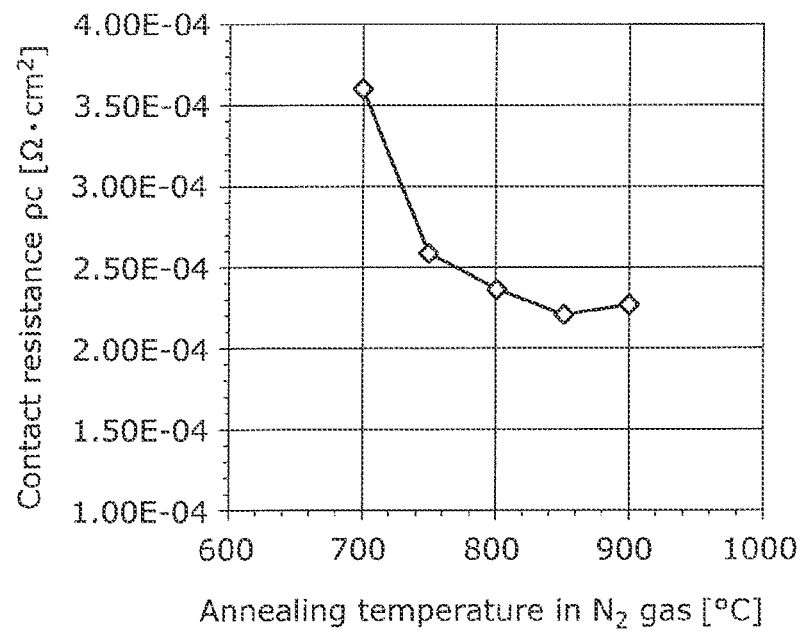
FIG. 7 is a graph showing temperature dependence of contact resistance between a p-type contact layer and the p-side electrode on annealing temperature in an $N_2$ gas atmosphere, in the semiconductor laser element according to Embodiment 1.

FIG. 7 is a graph showing temperature dependence of contact resistance between p-type contact layer 24 and p-side electrode 28 on the annealing temperature in an $N_2$ gas atmosphere, in semiconductor laser element 1 according to the present embodiment. In FIG. 7, the horizontal axis represents the annealing temperature of nitrogen annealing, and the vertical axis represents contact resistance ρc. Note that the plot in FIG. 7 shows contact resistances ρc at the time of nitrogen annealing performed at corresponding annealing temperatures for 30 minutes.

As illustrated in FIG. 7, contact resistance ρc decreases as the annealing temperature increases above 700 degrees Celsius. Accordingly, when the annealing temperature of nitrogen annealing is at least 800 degrees Celsius, contact resistance ρc can be sufficiently decreased to approximately $2.3 \times 10^{-4}$ $\Omega cm^2$ or less. Contact resistance ρc becomes smallest at the annealing temperature of approximately 850 degrees Celsius, and increases thereafter. It is considered that, when the annealing temperature of nitrogen annealing is 900 degrees Celsius or greater, the contact resistance increases due to release of nitrogen from p-type contact layer 24 or segregation caused by heat of Mg. Thus, the contact resistance can be sufficiently decreased by nitrogen annealing at a temperature of at least 800 degrees Celsius and at most 900 degrees Celsius, for example. The annealing temperature of nitrogen annealing may be at least 800 degrees Celsius and at most 850 degrees Celsius.

Figure 8:
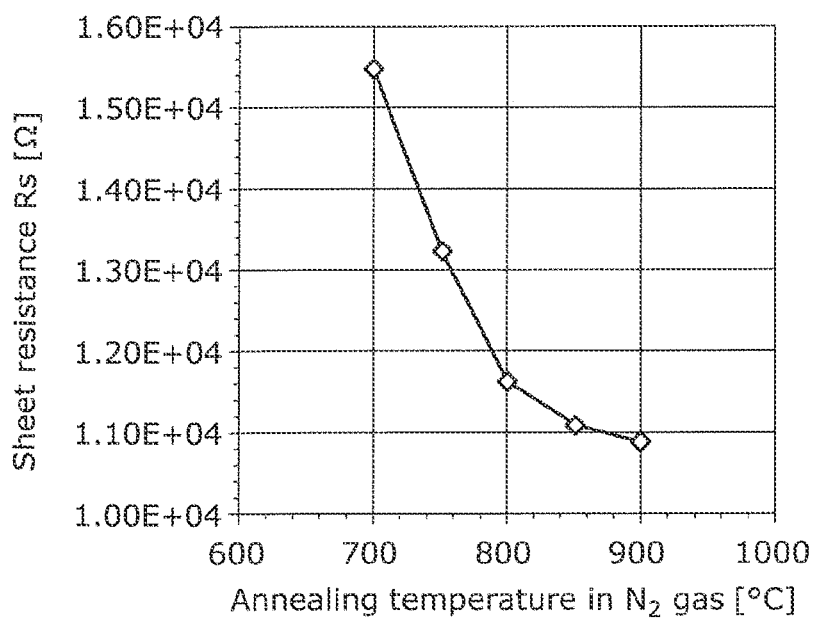
FIG. 8 is a graph showing temperature dependence of sheet resistance of the p-type clad layer on annealing temperature in an $N_2$ gas atmosphere, in the semiconductor laser element according to Embodiment 1.

FIG. 8 is a graph showing temperature dependence of sheet resistance of a p-type clad layer on the annealing temperature in an $N_2$ gas atmosphere, in semiconductor laser element 1 according to the present embodiment. In FIG. 8, the horizontal axis represents the annealing temperature of nitrogen annealing, and the vertical axis represents sheet resistance Rs.

As illustrated in FIG. 8, sheet resistance Rs decreases as the annealing temperature increases above 700 degrees Celsius. Specifically, sheet resistance Rs decreases by approximately 25% at annealing temperatures in a range from 700 degrees Celsius to 800 degrees Celsius. At around the annealing temperature exceeding 800 degrees Celsius, the degree of inclination representing decrease in sheet resistance Rs becomes smaller. Sheet resistance Rs decreases by approximately 6% at annealing temperatures in a range from 800 degrees Celsius to 900 degrees Celsius.

As described above, at the annealing temperature of at least 800 degrees Celsius, nitrogen annealing can effectively and sufficiently decrease sheet resistance Rs.

The following describes, with reference to FIG. 9 to FIG. 12, impacts of the second annealing in an oxidizing gas atmosphere (specifically, an $O_2$ gas atmosphere) performed after the first annealing in an inert gas atmosphere.

Figure 9:
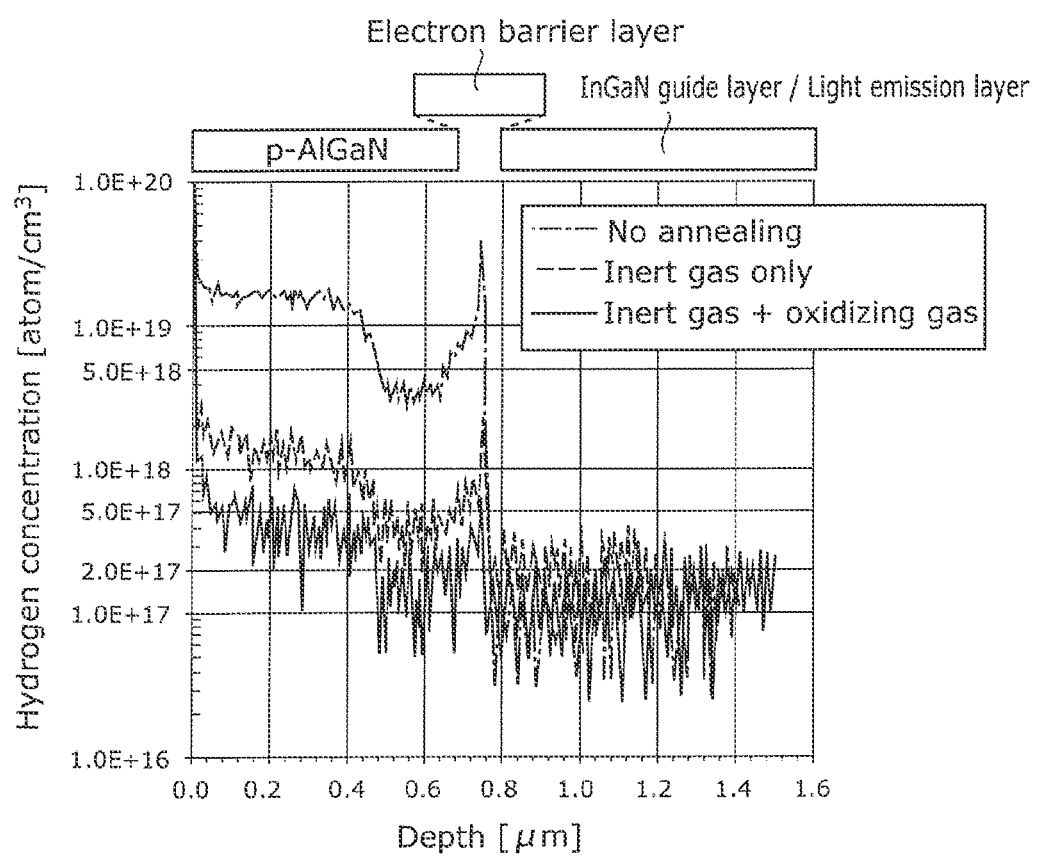
FIG. 9 is a graph showing hydrogen concentration distribution of the semiconductor laser element according to Embodiment 1, in the depth direction from the p-type clad layer to the light emission layer.

FIG. 9 is a graph illustrating hydrogen concentration distribution of semiconductor laser element 1 according to the present embodiment, in the depth direction from p-type clad layer 22 to light emission layer 16. In FIG. 9, the horizontal axis represents the depth from the upper surface of p-type contact layer 24 as in FIG. 5. The vertical axis represents hydrogen concentration obtained by SIMS analysis.

The graph "no annealing" represented by alternate long and short dashed lines in FIG. 9 is the same as the graph "before annealing" represented by a thick solid line in FIG. 5. The graph "inert gas only" represented by a broken line in FIG. 9 is the same as the graph of nitrogen annealing at "800° C., 60 mins" represented by a broken line in FIG. 5. The graph "inert gas+oxidizing gas" represented by a solid line in FIG. 9 is a graph of annealing with an inert gas and then annealing with an oxidizing gas. Specifically, the solid line graph shows hydrogen concentration distribution in the depth direction in the case of performing nitrogen annealing at 800 degrees Celsius for 20 minutes and then oxygen annealing at 700 degrees Celsius for 5 minutes.

As illustrated in FIG. 9, by performing nitrogen annealing and then oxygen annealing, the hydrogen concentration of p-type clad layer 22 becomes lower than in the case of performing nitrogen annealing only. Specifically, the hydrogen concentration of p-type clad layer 22 is equivalent to the hydrogen concentration in the case of performing nitrogen annealing at 920 degrees Celsius for 30 minutes.

For example, the hydrogen concentration of p-type clad layer 22 is at most $5.0 \times 10^{18}$ atom/cm³. For example, the p-type dopant concentration of the p-type AlGaN layer of p-type clad layer 22 located on the upper layer side is $1.0 \times 10^{19}$ atom/cm³ as illustrated in Table 1. In contrast, the hydrogen concentration of this p-type AlGaN layer after nitrogen annealing and oxygen annealing is at most $5.0 \times 10^{17}$ atom/cm³ as indicated in the depth range from 0.05 μm to 0.45 μm in FIG. 9. In other words, the hydrogen concentration of this p-type AlGaN layer is at most 5% of the p-type dopant concentration. As described above, even the layer having a high p-type dopant concentration can have the hydrogen concentration decreased by nitrogen annealing and oxygen annealing.

As the hydrogen concentration of p-type clad layer 22 is decreased, the hydrogen concentration of light emission layer 16 is also decreased. Specifically, the hydrogen concentration of light emission layer 16 is decreased to at most $2.0 \times 10^{17}$ atom/cm$^3$. This makes it possible to inhibit defects caused by hydrogen in light emission layer 16, and thus, reliable semiconductor laser element 1 can be realized.

In addition, according to the present embodiment, it is possible to make the total annealing period of nitrogen annealing and oxygen annealing (specifically, 25 minutes) shorter than the annealing period of nitrogen annealing only (specifically, 30 minutes). As a result, the period for manufacturing semiconductor laser element 1 can be shortened.

Figure 10:
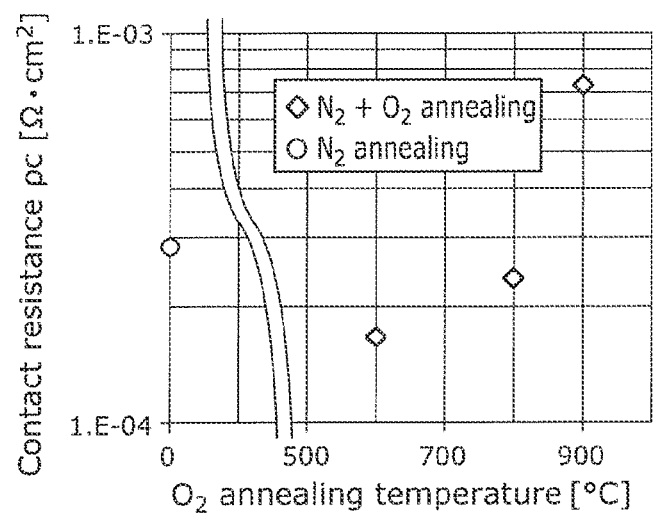
FIG. 10 is a graph showing temperature dependence of contact resistance between the p-type contact layer and the p-side electrode on annealing temperature in an $O_2$ gas atmosphere, in the semiconductor laser element according to Embodiment 1.

FIG. 10 is a graph showing annealing temperature dependence of contact resistance ρc between p-type contact layer 24 and p-side electrode 28 on the annealing temperature in an O$_2$ gas atmosphere, in semiconductor laser element 1 according to the present embodiment. In FIG. 10, the horizontal axis represents the annealing temperature of oxygen annealing, and the vertical axis represents contact resistance ρc. Note that the plot in FIG. 10 shows contact resistances ρc at the time of performing nitrogen annealing at 800 degrees Celsius for 20 minutes and then oxygen annealing at corresponding temperatures for 5 minutes.

As illustrated in FIG. 10, contact resistance ρc increases with the annealing temperature of oxygen annealing. As compared to the case of not performing oxygen annealing (plotted at the position corresponding 0 degrees Celsius for the sake of convenience), contact resistance ρc is decreased by performing oxygen annealing at the annealing temperature of 800 degrees Celsius or less. For example, by performing oxygen annealing at 600 degrees Celsius, the contact resistance can be decreased to approximately one half of the contact resistance in the case of not performing oxygen annealing. On the other hand, when oxygen annealing is performed at 900 degrees Celsius, contact resistance ρc becomes greater than the contact resistance in the case of not performing oxygen annealing. Note that the causes for the increase in the contact resistance in the case of annealing at a high temperature are considered to be oxidization of the surface of p-type contact layer 24 and Mg segregation in p-type contact layer 24. In addition, in the case of annealing at a high temperature, part of InGaN of light emission layer 16 is decomposed and the number of defects in light emission layer 16 increases, thereby imposing a risk of accelerating slow degradation of semiconductor laser element 1.

Figure 11:
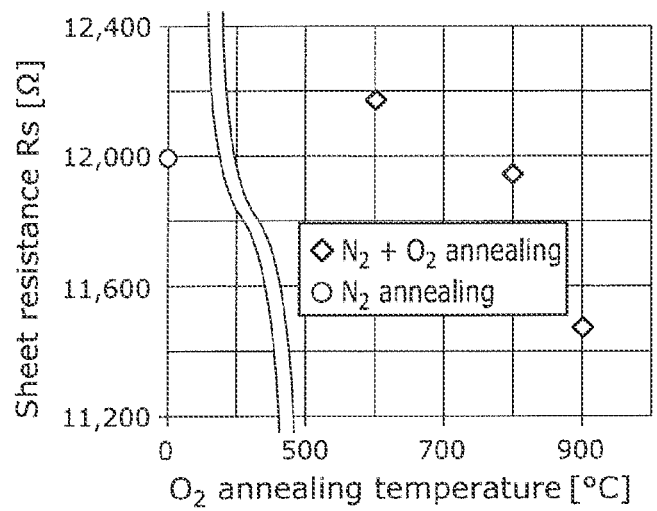
FIG. 11 is a graph showing temperature dependence of sheet resistance of the p-type clad layer on annealing temperature in an $O_2$ gas atmosphere, in the semiconductor laser element according to Embodiment 1.

FIG. 11 is a graph showing temperature dependence of sheet resistance Rs of p-type clad layer 22 on the annealing temperature in an O$_2$ gas atmosphere, in semiconductor laser element 1 according to the present embodiment. In FIG. 11, the horizontal axis represents the annealing temperature of oxygen annealing, and the vertical axis represents sheet resistance Rs. Note that the plot in FIG. 11 shows sheet resistances Rs at the time of performing nitrogen annealing at 800 degrees Celsius for 20 minutes and then oxygen annealing at corresponding temperatures for 5 minutes.

As illustrated in FIG. 11, sheet resistance Rs decreases as the annealing temperature of oxygen annealing increases. Specifically, when the annealing temperature is in a range from 600 degrees Celsius to 900 degrees Celsius, sheet resistance Rs can take a value in a range from approximately 12200Ω to approximately 11500Ω. That is to say, in the range from 600 degrees Celsius to 900 degrees Celsius, there could be a difference of approximately 700Ω at maximum in sheet resistance Rs. This maximum difference is approximately 5% of 12000Ω, which is the sheet resistance in the case of not performing oxygen annealing (plotted at the position corresponding 0 degrees Celsius for the sake of convenience). In other words, sheet resistance Rs stays about the same even when oxygen annealing is performed.

Accordingly, when oxygen annealing is performed at the temperature of at most 800 degrees Celsius, contact resistance ρc can be decreased while causing almost no change in sheet resistance Rs.

Figure 12:
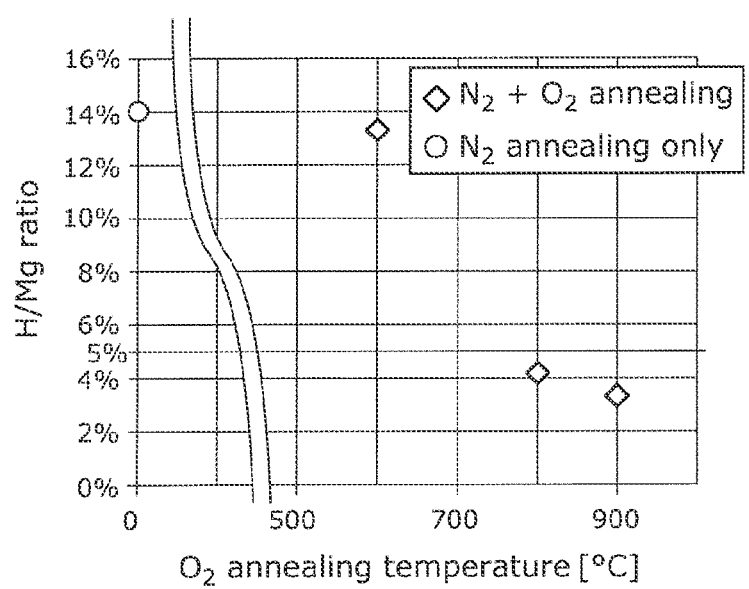
FIG. 12 is a graph showing temperature dependence of H/Mg ratio of the p-type clad layer on annealing temperature in an $O_2$ gas atmosphere, in the semiconductor laser element according to Embodiment 1.

FIG. 12 is a graph showing temperature dependence of H/Mg ratio of p-type clad layer 22 on the annealing temperature in an O$_2$ gas atmosphere, in semiconductor laser element 1 according to the present embodiment. In FIG. 12, the horizontal axis represents the annealing temperature of oxygen annealing. The vertical axis represents the H/Mg ratio, that is, a ratio of hydrogen concentration to concentration of Mg which is a p-type dopant. Note that the plot in FIG. 12 shows H/Mg ratios at the time of performing nitrogen annealing at 800 degrees Celsius for 20 minutes and then oxygen annealing at corresponding temperatures for 5 minutes.

As illustrated in FIG. 12, the H/Mg ratio decreases as the annealing temperature of oxygen annealing increases. Specifically, the H/Mg ratio is 14% in the case of not performing oxygen annealing (plotted at the position corresponding 0 degrees Celsius for the sake of convenience), whereas the H/Mg ratio is approximately 4% in the case of performing oxygen annealing at 800 degrees Celsius. That is to say, the H/Mg ratio can be decreased by approximately 70% by oxygen annealing at 800 degrees Celsius. Note that since annealing causes almost no change in the Mg concentration, the amount of decrease in the H/Mg ratio is substantially equivalent to the amount of decrease in the hydrogen concentration.

When oxygen annealing is performed at 600 degrees Celsius, the H/Mg ratio is approximately 13%, which means that a greater decrease can be achieved as compared to the case of not performing oxygen annealing. When oxygen annealing is performed at 900 degrees Celsius, the H/Mg ratio is approximately 3%, which means that a greater decrease can be achieved as compared to the case of performing oxygen annealing at 800 degrees Celsius. As described above, the rate of decrease in the H/Mg ratio brought about by oxygen annealing temperatures in a range from 600 degrees Celsius to 800 degrees Celsius is high, whereas the rate of decrease in the H/Mg ratio brought about by oxygen annealing temperatures in a range from 800 degrees Celsius to 900 degrees Celsius is low. Accordingly, the hydrogen concentration can be effectively decreased by oxygen annealing at the temperature of at least 700 degrees Celsius and at most 800 degrees Celsius, for example.

Figure 13:
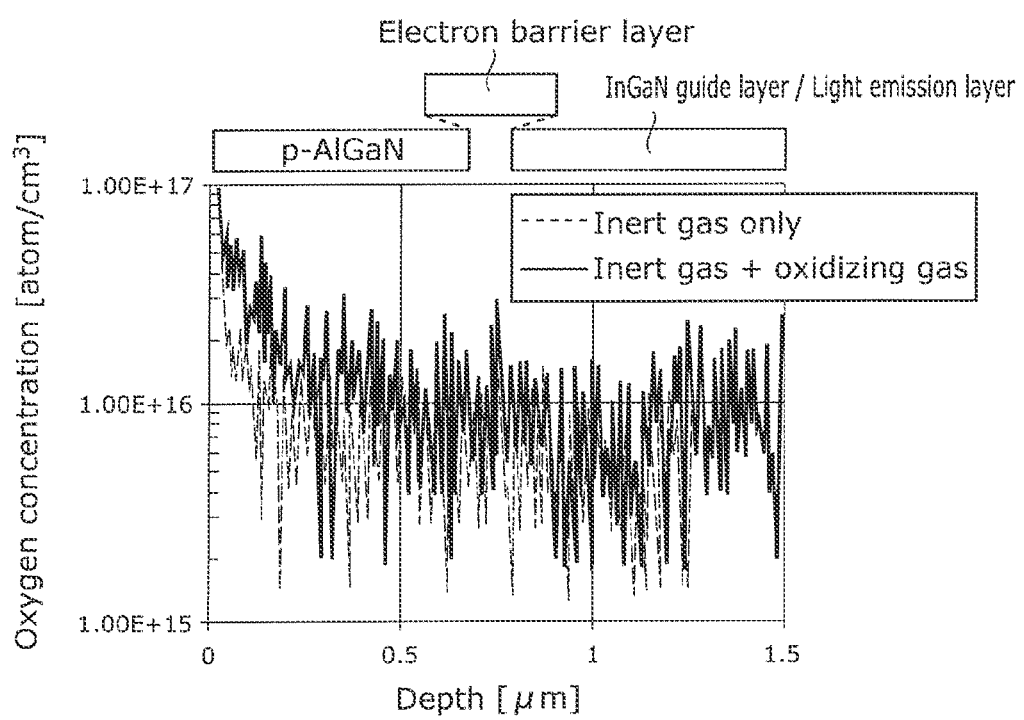
FIG. 13 is a graph showing oxygen concentration distribution of the semiconductor laser element according to Embodiment 1, in the depth direction from the p-type clad layer to the light emission layer.

The following describes, with reference to FIG. 13, a relationship between concentration distribution of oxygen added by oxygen annealing and the effect of inhibition of diffusion of hydrogen into light emission layer 16.

FIG. 13 is a graph showing oxygen concentration distribution of semiconductor laser element 1 according to the present embodiment, in the depth direction from p-type clad layer 22 to light emission layer 16. In FIG. 13, the horizontal axis represents the depth from the upper surface of p-type contact layer 24, and the vertical axis represents oxygen concentration obtained by SIMS analysis.

As illustrated in FIG. 13, the oxygen concentration is higher when nitrogen annealing and oxygen annealing are performed than when only nitrogen annealing is performed. The oxygen concentration of the p-type AlGaN layers is higher than the oxygen concentration of light emission layer 16. The oxygen concentration of the p-type AlGaN layers gradually increases from the light emission layer 16 side toward p-type contact layer 24.

Specifically, in the case of performing nitrogen annealing only, the oxygen concentration of the p-type AlGaN layers included in p-type clad layer 22 is approximately $1 \times 10^{16}$ atom/cm$^{-3}$, and the oxygen concentration of light emission layer 16 is approximately $5 \times 10^{15}$ atom/cm$^{-3}$. The oxygen concentration of the p-type AlGaN layers in the case of performing nitrogen annealing only is approximately 1.8 times higher than the oxygen concentration of light emission layer 16.

Specifically, in the case of performing nitrogen annealing and oxygen annealing, the oxygen concentration of the p-type AlGaN layers is approximately $2 \times 10^{16}$ atom/cm$^{-3}$, and the oxygen concentration of light emission layer 16 is approximately $8 \times 10^{15}$ atom/cm$^{-3}$. The oxygen concentration of the p-type AlGaN layers in the case of performing nitrogen annealing and oxygen annealing is approximately 2.5 times higher than the oxygen concentration of light emission layer 16.

As described above, by performing nitrogen annealing and then oxygen annealing, the oxygen concentrations of the p-type AlGaN layers and light emission layer 16 can be increased. In addition, more oxygen is supplied to the p-type AlGaN layers than to light emission layer 16. By having a lot of oxygen, the p-type AlGaN layers can enhance the effect of trapping hydrogen. It is presumed that such an enhanced effect of trapping hydrogen makes it possible to inhibit diffusion of hydrogen from the p-type AlGaN layers into light emission layer 16. Specifically, the hydrogen concentration of light emission layer 16 is approximately $1.5 \times 10^{17}$ atom/cm$^{-3}$ as illustrated in FIG. 5.

Accordingly, since occurrence of defects attributable to hydrogen in light emission layer 16 can be inhibited, it is possible to inhibit a decrease in the light emission efficiency and slow degradation of light output. Accordingly, the present embodiment can realize reliable semiconductor laser element 1.

Embodiment 2

Next, Embodiment 2 will be described. A nitride-based semiconductor light-emitting element according to Embodiment 2 is different from the nitride-based semiconductor light-emitting element according to Embodiment 1 in the manufacturing method thereof. The following description will focus on the aspects different from Embodiment 1, and omit or simplify the common aspects.

Figure 14:
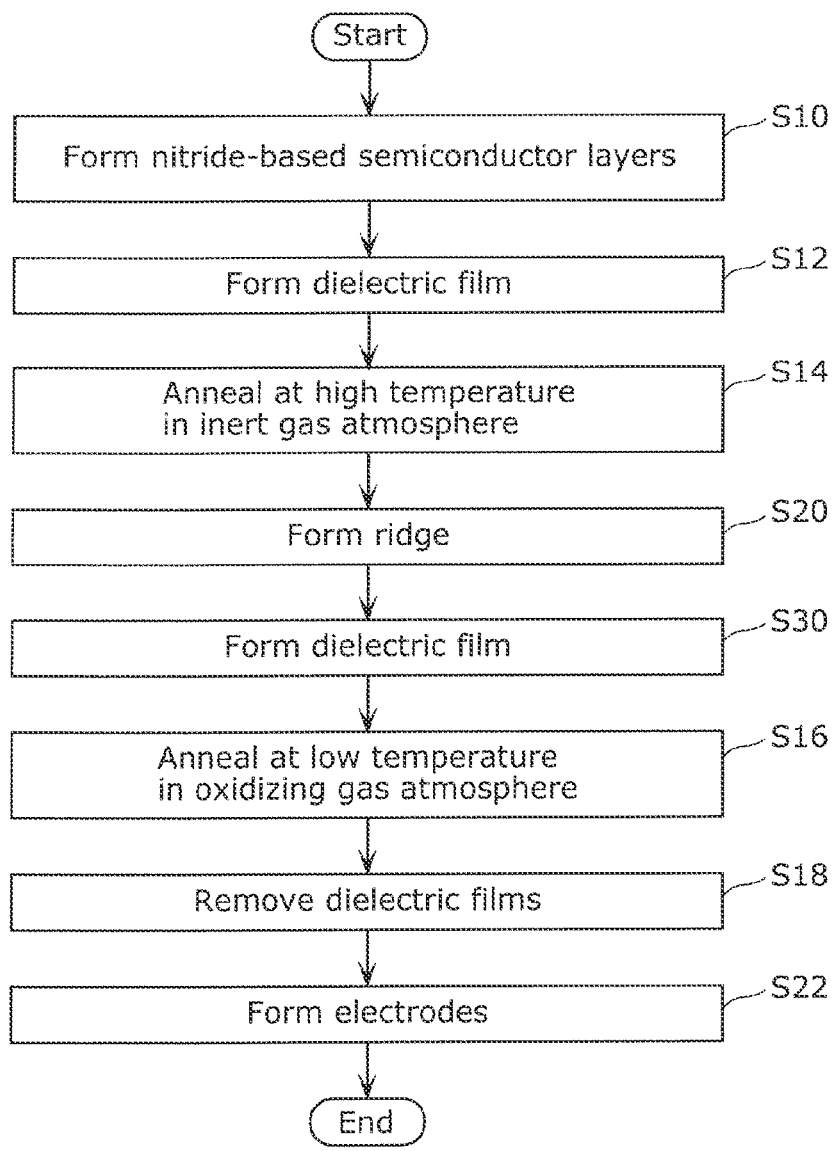
FIG. 14 is a flowchart illustrating a manufacturing method of a semiconductor laser element according to Embodiment 2.

FIG. 14 is a flowchart illustrating a manufacturing method of semiconductor laser element 1 according to the present embodiment. As illustrated in FIG. 14, the processing from forming of a plurality of nitride-based semiconductor layers (S10) to annealing in an inert gas atmosphere (S14, first annealing) are the same as in Embodiment 1.

In the present embodiment, a ridge is formed by annealing at a temperature of at least 800 degrees Celsius in an inert gas atmosphere (that is, first annealing) and then removing part of the plurality of nitride-based semiconductor layers (S20). Specifically, as in Embodiment 1, element isolation trenches 34 and trenches 32 for forming the ridge are formed as illustrated in FIG. 3C.

Figure 15:
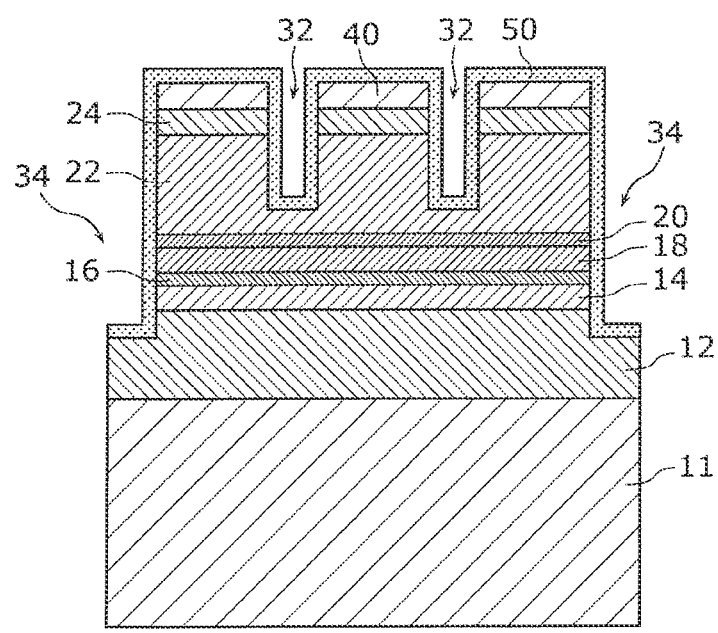
FIG. 15 is a cross-sectional view illustrating forming of a dielectric film included in the manufacturing method of the semiconductor laser element according to Embodiment 2.

Next, a dielectric film is formed (S30). Specifically, as illustrated in FIG. 15, dielectric film 50 is formed along the lateral surfaces of element isolation trenches 34 and trenches 32 to cover p-type contact layer 24. At this time, dielectric film 50 is formed so as to cover dielectric film 40 that has been formed before the first annealing. Dielectric film 50 is a silicon oxide film, for example, and is formed by a plasma CVD method etc. Dielectric film 50 is provided to inhibit release of nitrogen from the nitride-based semiconductor layers at the time of annealing. Note that FIG. 15 is a cross-sectional view illustrating forming of dielectric film 50 included in the manufacturing method of semiconductor laser element 1 according to the present embodiment.

Next, as illustrated in FIG. 14, annealing is performed at a temperature of at most 800 degrees Celsius in an oxidizing gas atmosphere (that is, second annealing) (S16). Subsequently, dielectric films 40 and 50 which have been formed are removed (S18), and then p-side electrode 28 and n-side electrode 30 are formed (S22). The details of the second annealing, the removing of the dielectric films, and the forming of the electrodes are the same as in Embodiment 1.

As described above, in the present embodiment, the forming of a ridge (S20) is performed after the first annealing (S14), before the second annealing (S16). By performing annealing after forming a ridge, it is possible to relax residual stress generated at the time of forming the ridge. Note that the residual stress can be measured by, for example, analyzing vibration of a crystal lattice by Raman spectroscopy or analyzing an electronic structure change by a cathodoluminescence method. In addition, by oxidizing the lateral surfaces of the ridge, it is possible to inhibit waste current flowing in the lateral surfaces of the ridge. By relaxing the stress and inhibiting the waste current, the current-light output characteristics of semiconductor laser element 1 can be improved.

Embodiment 3

Next, Embodiment 3 will be described. A nitride-based semiconductor light-emitting element according to Embodiment 3 is different from the nitride-based semiconductor light-emitting element according to Embodiment 1 in the manufacturing method thereof. The following description will focus on the aspects different from Embodiment 1, and omit or simplify the common aspects.

Figure 16:
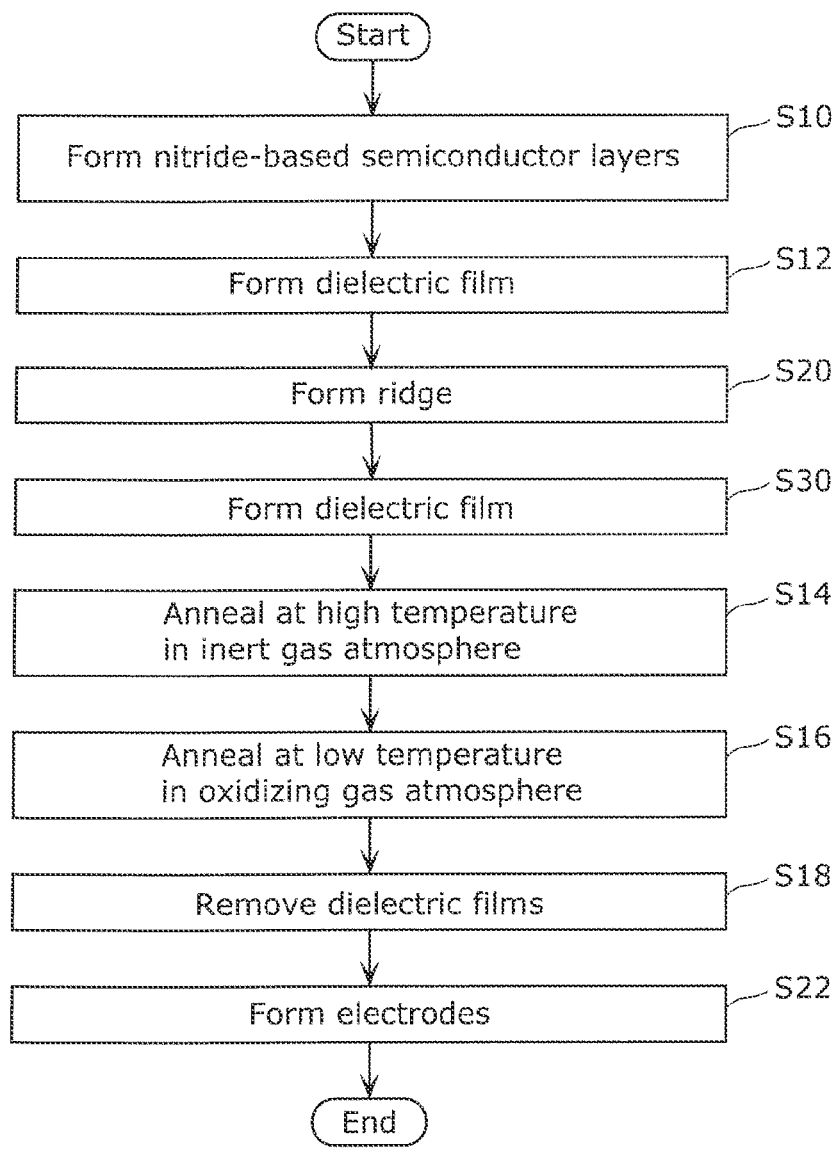
FIG. 16 is a flowchart illustrating a manufacturing method of a semiconductor laser element according to Embodiment 3.

FIG. 16 is a flowchart illustrating a manufacturing method of semiconductor laser element 1 according to the present embodiment. As illustrated in FIG. 16, the forming of a plurality of nitride-based semiconductor layers (S10) and the forming of dielectric film 40 (S12) are the same as in Embodiment 1.

In the present embodiment, a ridge is formed by removing part of the plurality of nitride-based semiconductor layers before annealing (S20). Specifically, as in Embodiment 1, element isolation trenches 34 and trenches 32 for forming the ridge are formed as illustrated in FIG. 3C.

Next, dielectric film 50 is formed as in Embodiment 2 (S30). Specifically, as illustrated in FIG. 15, dielectric film 50 is formed along the lateral surfaces of element isolation trenches 34 and trenches 32 to cover p-type contact layer 24. Dielectric film 50 is a silicon oxide film, for example, and is formed by a plasma CVD method etc. Dielectric film 50 need not be a silicon oxide film. Dielectric film 50 may be at least one oxide selected from a group consisting of tantalum, vanadium, tin, indium, molybdenum, tungsten, niobium, titanium, cobalt, manganese, yttrium, and silicon. Alternatively, dielectric film 50 may be a plurality of oxides selected from this group.

Next, annealing is performed at a temperature of at least 800 degrees Celsius in an inert gas atmosphere (S14, first annealing). Following the first annealing, annealing is performed at a temperature of at most 800 degrees Celsius in an oxidizing gas atmosphere (S16, second annealing). Subsequently, as in Embodiment 2, dielectric films 40 and 50 which have been formed are removed (S18), and then p-side electrode 28 and n-side electrode 30 are formed (S22). The details of the first annealing, the second annealing, the removing of the dielectric films, and the forming of the electrodes are the same as in Embodiment 1.

As described above, in the present embodiment, the forming of a ridge (S20) is performed before the first annealing (S14). By performing annealing after forming a ridge, it is possible to relax residual stress generated at the time of forming the ridge.

Figure 17:
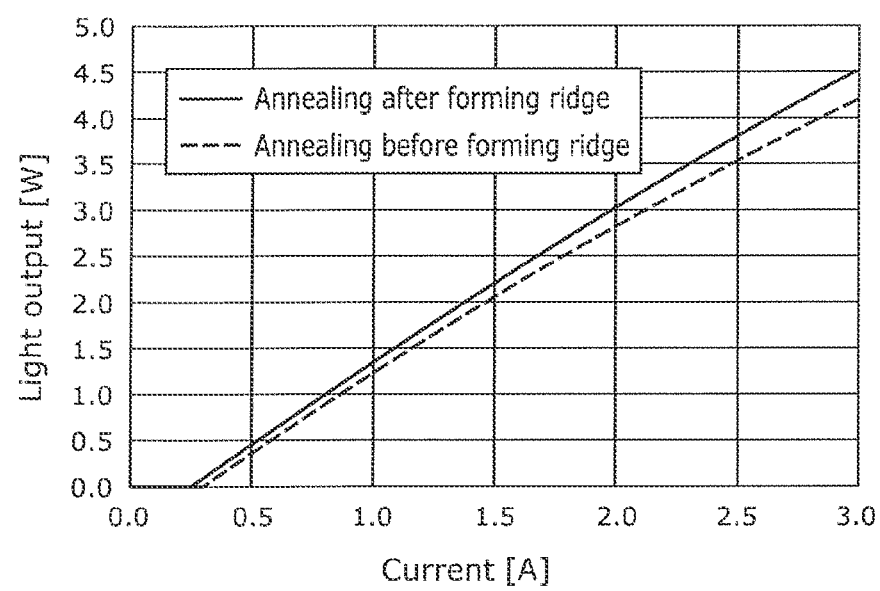
FIG. 17 is a graph illustrating current-light output characteristics of the semiconductor laser element according to Embodiment 3.

FIG. 17 is a graph illustrating current-light output characteristics of semiconductor laser element 1 according to the present embodiment. In FIG. 17, the horizontal axis represents current that flows when semiconductor laser element 1 operates. The vertical axis represents light output when semiconductor laser element 1 operates.

As illustrated in FIG. 17, light output in relation to a given current in the case of performing annealing after forming a ridge is greater than light output in relation to the same current in the case of performing annealing before forming a ridge. That is to say, in the present embodiment, the light emission efficiency of semiconductor laser element 1 is increased.

This is considered attributable to maintaining a sufficient bandgap in light emission layer 16 under the ridge by the relaxation of the residual stress generated at the time of forming the ridge. In other words, the relaxation of the residual stress maintains small difference between the bandgap in light emission layer 16 under the ridge and that in the other portions of light emission layer 16. Note that the residual stress can be measured by Raman spectroscopy, for example. It is also considered that, as a result of annealing after forming the ridge, an etching damaged layer on the ridge lateral surfaces is restored and an oxide is formed on the ridge lateral surfaces, thereby inhibiting waste current flowing in the etching damaged layer or a surface layer of the ridge lateral surfaces.

Variation of Embodiment 3

Next, a variation of Embodiment 3 will be described.

The present variation will describe, as an example of the nitride-based semiconductor light-emitting element, a light-emitting diode element in which an n-side electrode and a p-side electrode are provided on one surface side of a substrate. Note that the following description will focus on the aspects different from Embodiment 3, and omit or simplify the common aspects.

Figure 18:
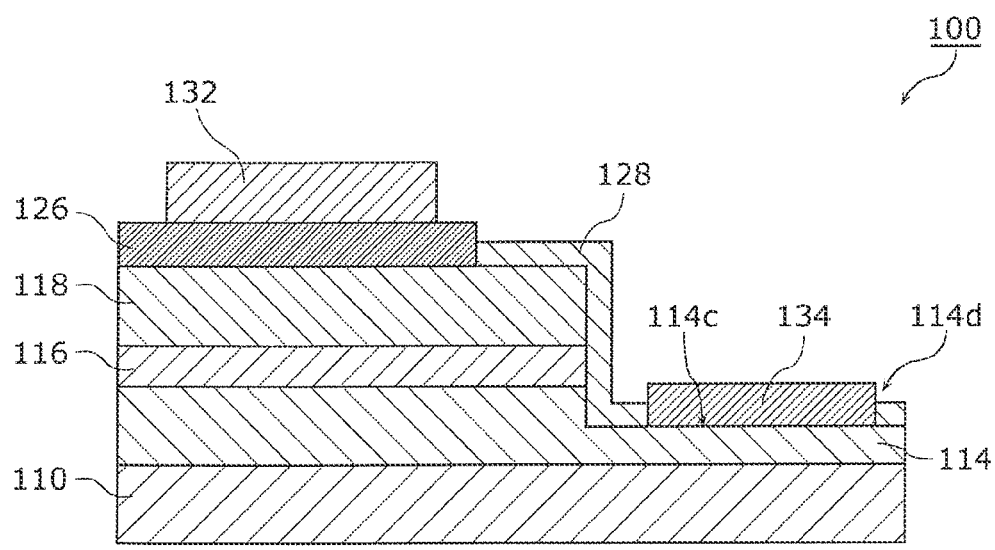
FIG. 18 is a cross-sectional view illustrating a configuration of a light-emitting diode element according to a variation of Embodiment 3.

FIG. 18 is a cross-sectional view illustrating a configuration of light-emitting diode element 100 according to the present variation. As illustrated in FIG. 18, light-emitting diode element 100 includes substrate 110, first n-type nitride-based semiconductor layer 114, light emission layer 116, p-type nitride-based semiconductor layer 118, p-side electrode 126, insulating film 128, metal bump 132, and n-side electrode 134. In the present variation, for convenience of explanation, the direction in which substrate 110 is located with respect to light emission layer 116 is referred to as "lower (the lower layer side)", and the opposite direction is referred to as "upper (the upper layer side)".

First n-type nitride-based semiconductor layer 114 is provided on the upper surface of substrate 110. Substrate 110 is, for example, an insulating sapphire substrate having the C-plane as a principal surface, but may be a sapphire substrate having another plane direction or a semiconductor substrate such as a nitride-based semiconductor substrate, a Si substrate, or a SiC substrate. The thickness, shape, and dimensions of substrate 110 are not particularly limited.

As illustrated in FIG. 18, first n-type nitride-based semiconductor layer 114 includes recess 114$d$. Recess 114$d$ is provided in a region not overlapping with light emission layer 116 in plan view. This gives first n-type nitride-based semiconductor layer 114 one thickness in the region overlapping with light emission layer 116 in plan view and another thickness in the region not overlapping with light emission layer 116 in plan view. These thicknesses are different from one another. For example, the lateral surface of recess 114$d$ is flush with the end surfaces of light emission layer 116 and p-type nitride-based semiconductor layer 118. N-side electrode 134 is provided on bottom surface 114$c$ of recess 114$d$ that is part of first n-type nitride-based semiconductor layer 114.

Light emission layer 116 is a layer forming a light emitter of light-emitting diode element 100. Light emission layer 116 is provided between first n-type nitride-based semiconductor layer 114 and p-type nitride-based semiconductor layer 118, in contact with each of first n-type nitride-based semiconductor layer 114 and p-type nitride-based semiconductor layer 118. Light emission layer 116 is patterned into a predetermined shape, and does not overlap with n-side electrode 134 in plan view. Light emission layer 116 has a multi quantum well structure or a single quantum well structure. Light emission layer 116 may have the same configuration as, for example, light emission layer 16 according to Embodiment 1.

P-type nitride-based semiconductor layer 118 is an example of a p-type nitride-based semiconductor layer laminated on a side of the first n-type nitride-based semiconductor layer opposite the side thereof where substrate 110 is provided. P-type nitride-based semiconductor layer 118 is provided between light emission layer 116 and p-side electrode 126, in contact with each of light emission layer 116 and p-side electrode 126. P-type nitride-based semiconductor layer 118 is patterned into a predetermined shape, and does not overlap with n-side electrode 134 in plan view. P-type nitride-based semiconductor layer 118 has the same plan view shape and dimensions as light emission layer 116. P-type nitride-based semiconductor layer 118 is, for example, a GaN layer having Mg, which is an example of a p-type impurity, added thereto. Note that p-type nitride-based semiconductor layer 118 may be an AlGaN layer having Mg added thereto.

P-side electrode 126 is provided in contact with p-type nitride-based semiconductor layer 118. P-side electrode 126 is formed using indium tin oxide (ITO). The surface area of p-side electrode 126 in plan view is $4.8 \times 10^{-3}$ cm$^2$, for example. P-side electrode 126 does not overlap with recess 114$d$ in plan view. Here, p-side electrode 126 formed using ITO also functions as a translucent electrode, and thus, light generated by light emission layer 116 can be extracted through p-side electrode 126.

Insulating film 128 covers part of the upper surface of p-type nitride-based semiconductor layer 118 which is uncovered by p-side electrode 126, the end surface of p-type nitride-based semiconductor layer 118, the end surface of light emission layer 116, and part of recess 114$d$ which is uncovered by n-side electrode 134. In other words, insulating film 128 is located between p-side electrode 126 and n-side electrode 134 in plan view, and inhibits short-circuit between p-side electrode 126 and n-side electrode 134. Insulating film 128 is a silicon oxide film, for example.

Metal bump 132 is provided in contact with p-side electrode 126. Metal bump 132 is Au, for example.

N-side electrode 134 is an example of an n-side electrode which is in contact with the first n-type nitride-based semiconductor layer. N-side electrode 134 is in contact with first n-type nitride-based semiconductor layer 114. The surface area of n-side electrode 134 in plan view is $6.0\times10^{-4}$ cm$^2$, for example.

Light-emitting diode element 100 having the above configuration emits blue light, for example. The chip width of light-emitting diode element 100 is 784 µm. The maximum operating current of light-emitting diode element 100 is 1.4 A. Here, the current density of p-side electrode 126 is 0.3 kAcm$^{-2}$, and the current density of n-side electrode 134 is 2.3 kAcm$^{-2}$. The operating voltage of light-emitting diode element 100 is 3.8 V, and the maximum junction temperature in operation is 150 degrees Celsius. Note that these numerical values are mere examples, and may be altered as appropriate.

Figure 19:
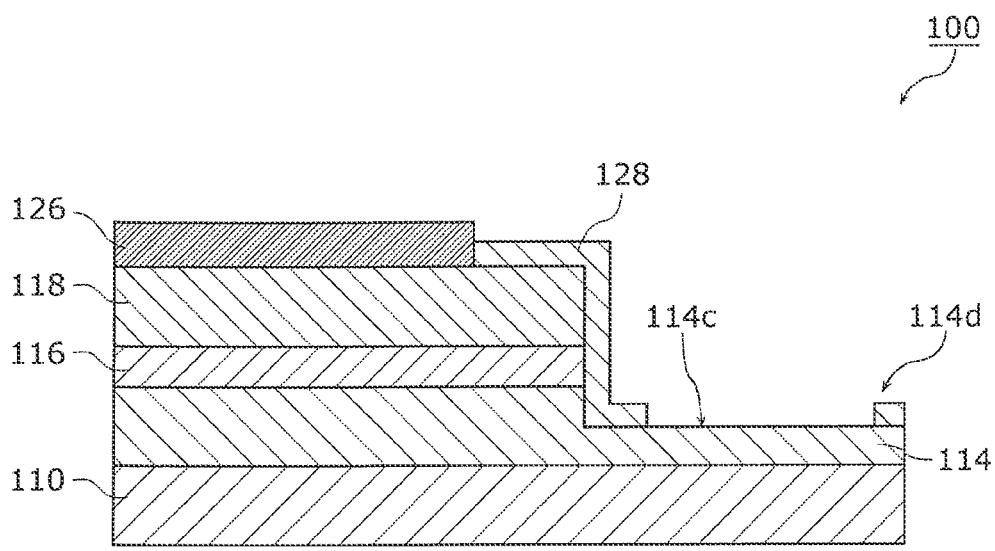
FIG. 19 is a cross-sectional view illustrating removing of semiconductor layers and forming of an insulating film that are included in the manufacturing method of the light-emitting diode element according to the variation of Embodiment 3.

Next, a manufacturing method of light-emitting diode element 100 according to the present variation will be described with reference to FIG. 19. FIG. 19 is a cross-sectional view illustrating removing of semiconductor layers and forming of an insulating film that are included in the manufacturing method of light-emitting diode element 100 according to the present variation.

After a low-temperature buffer layer (not illustrated) is formed on substrate 110, an n-type nitride-based semiconductor film, a nitride-based semiconductor film, and a p-type nitride-based semiconductor film are formed in the stated sequence. Next, part of the plurality of nitride-based semiconductor films formed is removed. Specifically, part of the p-type nitride-based semiconductor film, part of the nitride-based semiconductor film, and part of the n-type nitride-based semiconductor film that are located in a predetermined region in plan view are removed in the stated sequence by dry etching. With this, as illustrated in FIG. 19, p-type nitride-based semiconductor layer 118 and light emission layer 116 patterned into predetermined shapes and recess 114d of first n-type nitride-based semiconductor layer 114 are formed.

Next, insulating film 128 and p-side electrode 126 are formed. Specifically, insulating film 128 is formed to have openings in the regions where p-side electrode 126 and n-side electrode 134 are to be formed. After that, p-side electrode 126 is formed in the exposed region of p-type nitride-based semiconductor layer 118 as illustrated in FIG. 19.

After that, the first annealing and the second annealing are performed in sequence as in Embodiment 3.

Lastly, as illustrated in FIG. 18, n-side electrode 134 is formed in the opening of insulating film 128 at bottom surface 114c of recess 114d, and metal bump 132 is formed on part of the upper surface of p-side electrode 126 used in the annealing.

In the present variation, it is possible to inhibit diffusion of hydrogen into light emission layer 116 by decreasing the hydrogen concentration of p-type nitride-based semiconductor layer 118 as low as the hydrogen concentration of light emission layer 116.

Embodiment 4

Next, Embodiment 4 will be described. A nitride-based semiconductor light-emitting element according to Embodiment 4 is different from the nitride-based semiconductor light-emitting elements according to Embodiments 1 to 3 in the manufacturing method thereof. Specifically, in the present embodiment, annealing in an inert gas atmosphere (first annealing) is performed, and annealing in an oxidizing gas atmosphere (second annealing) is not performed. The following description will focus on the aspects different from Embodiments 1 to 3, and omit or simplify the common aspects.

Figure 20:
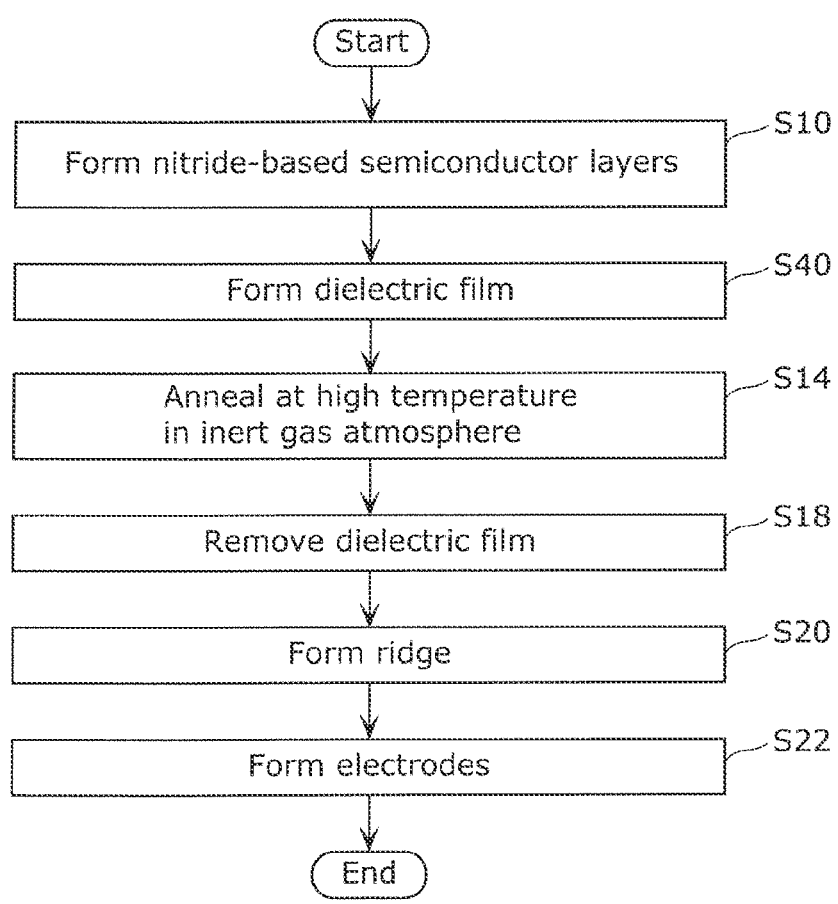
FIG. 20 is a flowchart illustrating a manufacturing method of a semiconductor laser element according to Embodiment 4.

FIG. 20 is a flowchart illustrating a manufacturing method of semiconductor laser element 1 according to the present embodiment. As illustrated in FIG. 20, first, a plurality of nitride-based semiconductor layers are formed (S10). The forming of a plurality of nitride-based semiconductor layers is the same as in Embodiment 1.

Next, a dielectric film is formed on the nitride-based semiconductor layers (S40). Specifically, as illustrated in FIG. 21, dielectric film 60 including oxides is formed on p-type seventh semiconductor layer 25 (p-type contact layer 24).

Figure 21:
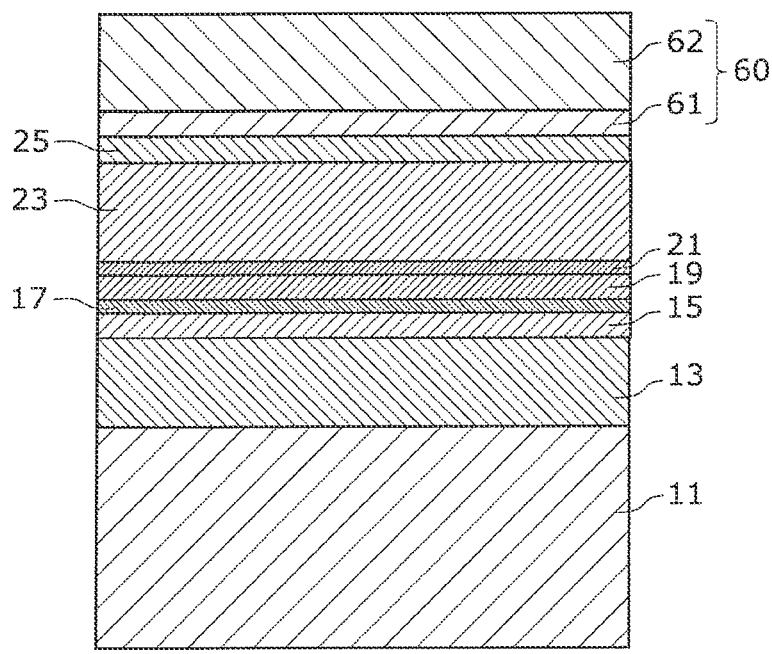
FIG. 21 is a cross-sectional view illustrating forming of a dielectric film included in the manufacturing method of the semiconductor laser element according to Embodiment 4.

Note that FIG. 21 is a cross-sectional view illustrating forming of dielectric film 60 included in the manufacturing method of semiconductor laser element 1 according to the present embodiment. As illustrated in FIG. 21, first dielectric film 61 and second dielectric film 62 are formed on seventh semiconductor layer 25 in the stated sequence.

First dielectric film 61 is a silicon oxide film. The thickness of first dielectric film 61 is 40 nm, for example. In the present embodiment, a silicon oxide film is formed as first dielectric film 61 by a CVD method at normal pressures.

Second dielectric film 62 is a dielectric film different from first dielectric film 61, and is a tantalum oxide film, for example. The thickness of second dielectric film 62 is 150 nm, for example. In the present embodiment, a tantalum oxide film is formed as second dielectric film 62 using an electron cyclotron resonance (ECR) plasma film-forming apparatus.

Note that second dielectric film 62 need not be a tantalum oxide film. Second dielectric film 62 may be at least one oxide selected from a group consisting of tantalum, vanadium, tin, indium, molybdenum, tungsten, niobium, titanium, cobalt, manganese, yttrium, and silicon. Alternatively, second dielectric film 62 may be a plurality of oxides selected from this group. Furthermore, second dielectric film 62 is desirably, among the oxides indicated above, a metal oxide whose central metal is more than tetravalent. Since a polyvalent metal oxide which is more than tetravalent is excellent in hydrogen absorption and permeation, it is possible to efficiently desorb hydrogen from the semiconductor layers. Therefore, a tantalum oxide is used in the present embodiment.

By providing second dielectric film 62, it is possible to sufficiently decrease the hydrogen concentration of p-type clad layer 22 after annealing. Note that if a tantalum oxide film is formed directly on p-type seventh semiconductor layer 25, it is difficult to remove the tantalum oxide film. In the present embodiment, dielectric film 60 can be easily removed because first dielectric film 61 including a silicon oxide film is provided between seventh semiconductor layer 25 and second dielectric film 62 which is a tantalum oxide film.

As illustrated in FIG. 20, after forming dielectric film 60, annealing is performed at a temperature of at least 800 degrees Celsius in an inert gas atmosphere (S14). Specifically, annealing is performed for 30 minutes at a temperature of 800 degrees Celsius in a nitrogen gas atmosphere. The flow rate of the nitrogen gas is 6 slm, for example.

Next, after the annealing, dielectric film 60 is removed (S18). Dielectric film 60 is removed by dry etching or wet etching, or both.

After dielectric film 60 is removed, the plurality of nitride-based semiconductor layers are patterned (S20). Specifically, as in Embodiment 1, element isolation trenches 34 and trenches 32 for forming a ridge are formed.

After the ridge is formed, p-side electrode 28 and n-side electrode 30 are formed (S22). The specific processing for forming the electrodes is the same as in Embodiment 1.

As described above, in the manufacturing method of semiconductor laser element 1 according to the present embodiment, annealing is performed after forming dielectric film 60. Dielectric film 60 promotes desorption of hydrogen, thus enabling sufficient decrease in the hydrogen concentration of p-type clad layer 22.

Note that the removing of dielectric film 60 may be omitted. That is to say, semiconductor laser element 1 according to the present embodiment may include dielectric film 60 as a part or whole of current block layer 26.

Figure 22:
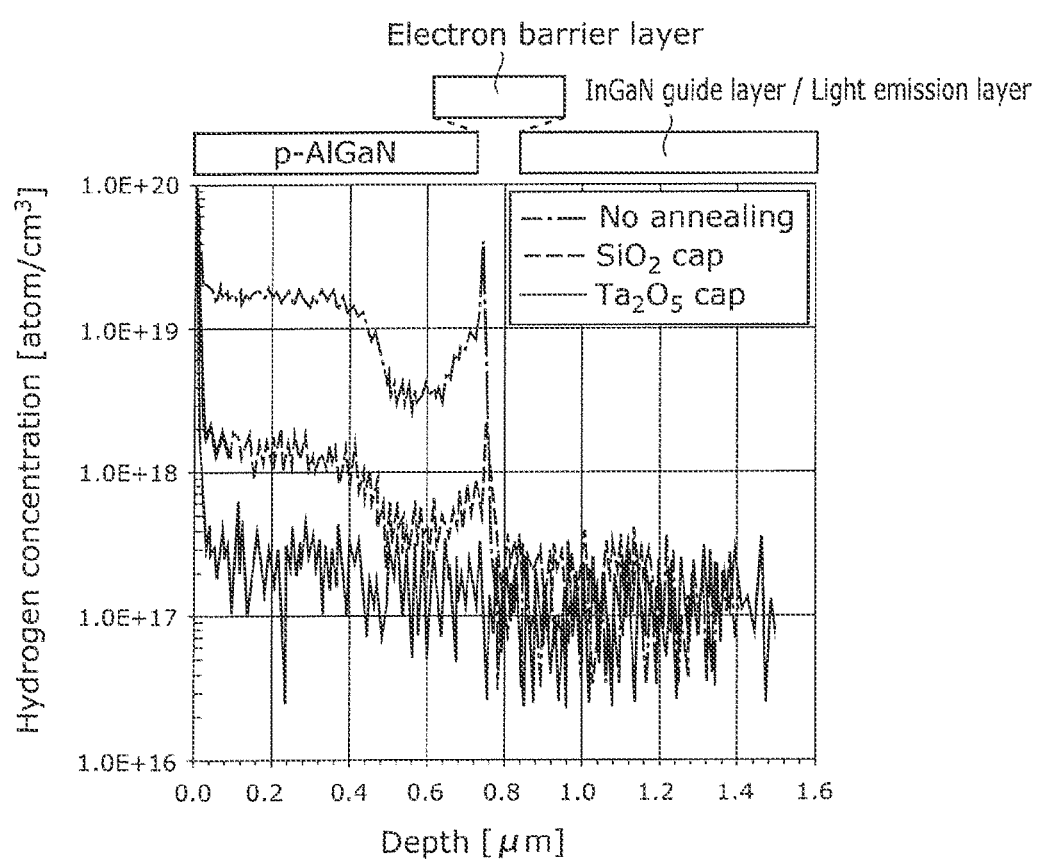
FIG. 22 is a graph showing hydrogen concentration distribution of the semiconductor laser element according to Embodiment 4, in the depth direction from a p-type clad layer to a light emission layer.

FIG. 22 is a graph showing hydrogen concentration distribution of semiconductor laser element 1 according to the present embodiment, in the depth direction from p-type clad layer 22 to light emission layer 16. In FIG. 22, the horizontal axis represents the depth from the upper surface of p-type contact layer 24. The vertical axis represents hydrogen concentration obtained by SIMS analysis.

The graph "no annealing" represented by alternate long and short dashed lines in FIG. 22 is the same as the graph "before annealing" represented by a thick solid line in FIG. 5. The graph "$SiO_2$ cap" represented by a broken line in FIG. 22 shows the hydrogen concentration distribution in the depth direction in the case where a silicon oxide film having a thickness of 200 nm is formed instead of dielectric film 60, and then nitrogen annealing is performed for 30 minutes at 800 degrees Celsius. The graph "$Ta_2O_5$ cap" represented by a solid line in FIG. 22 shows the hydrogen concentration distribution in the depth direction in the case where dielectric film 60 according to the present embodiment is formed, and then nitrogen annealing is performed for 30 minutes at 800 degrees Celsius.

As illustrated in FIG. 22, by performing nitrogen annealing after forming dielectric film 60 including a tantalum oxide film, the hydrogen concentration of p-type clad layer 22 (the p-type AlGaN layers) is decreased as low as the hydrogen concentration of light emission layer 16. Specifically, as in Embodiment 1, the hydrogen concentration of p-type clad layer 22 after annealing is at most $5.0 \times 10^{18}$ atom/cm$^3$, and at most 5% of the p-type dopant concentration. This makes it possible to inhibit diffusion of hydrogen into light emission layer 16.

As illustrated in FIG. 22, since the hydrogen concentration of light emission layer 16 is at most $2.0 \times 10^{17}$ atom/cm$^3$, occurrence of defects attributable to hydrogen in light emission layer 16 is inhibited. As described above, according to the present embodiment, the tantalum oxide film is excellent in hydrogen absorption and permeation, and makes it possible to efficiently desorb hydrogen in the p-type nitride-based semiconductor layers and the $SiO_2$ film by annealing. Accordingly, by forming dielectric film 60 including a tantalum oxide film before annealing, hydrogen can be effectively desorbed by annealing, and the hydrogen concentration of light emission layer 16 can be decreased. For example, reliable semiconductor laser element 1 can be realized without annealing in an oxidizing gas atmosphere.

Embodiment 5

The following description of Embodiment 5 will focus on the aspects different from Embodiments 1 to 4, and omit or simplify the common aspects. In a nitride-based semiconductor light-emitting element according to Embodiment 5, a translucent electrode is used as an electrode in contact with a p-type contact layer.

Figure 23:
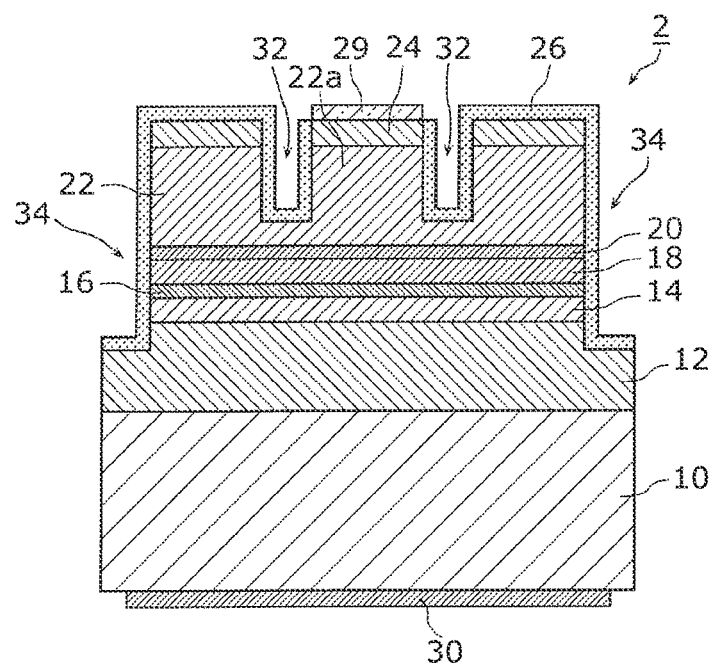
FIG. 23 is a cross-sectional view illustrating a configuration of a semiconductor laser element according to Embodiment 5.

FIG. 23 is a cross-sectional view illustrating a configuration of semiconductor laser element 2 according to the present embodiment. As compared to semiconductor laser element 1 according to Embodiment 1, semiconductor laser element 2 illustrated in FIG. 23 includes, as a p-side electrode, p-side translucent electrode 29 in contact with p-type contact layer 24. In the present embodiment, p-side translucent electrode 29 is formed using indium tin oxide (ITO), for example.

Processing performed prior to forming p-side translucent electrode 29 is the same as the processing included in the manufacturing method according to any one of Embodiments 1 to 4. Specifically, by applying a photosensitive resist and performing photolithography on current block layer 26, a resist layer having an opening only in the upper portion of the ridge is formed. Next, an ITO film is formed on the resist layer, using an ECR plasma film-forming device. The ITO film may be formed by a vapor deposition method or a laser evaporation deposition method. After the ITO film is formed, p-side translucent electrode 29 is formed on p-type contact layer 24 by a lift-off method.

The ITO film is an electrically-conductive translucent material having oxygen deficiency, and is known to have a degree of transparency (transmittance) that decreases due to the reduction action caused by hydrogen. In the present embodiment, since the concentration of hydrogen in the nitride-based semiconductor layers is suppressed low, the ITO film is not susceptible to hydrogen desorbed from p-type clad layer 22 due to heat generated by passage of current. For this reason, the ITO film can maintain its degree of transparency, and thus, it is possible to provide a reliable semiconductor light-emitting element having no occurrence of a new light loss.

OTHER EMBODIMENTS

A nitride-based semiconductor light-emitting element and a manufacturing method thereof and a manufacturing method of a nitride-based semiconductor device according to one or more aspects have been described above based on exemplary embodiments; however, the present disclosure is not limited to these embodiments. Other embodiments achieved by making various modifications to the above embodiments that are conceivable by a person of skill in the art as well as embodiments achieved by combining constituent elements of two or more embodiments which are within the essence of the present disclosure fall within the scope of the present disclosure.

For example, in the above embodiments, the inert gas used in the first annealing need not be a nitrogen gas, and may be a noble gas such as argon. The oxidizing gas used in the second annealing need not be an oxygen gas, and may be a nitrous oxide, nitrogen dioxide, ozone, or the like.

In addition, in the above embodiments, when growing the light emission layer, a nitrogen gas may be used as the carrier gas instead of a hydrogen gas. Use of a nitrogen gas as the carrier gas makes it easier to increase the composition ratio of In.

For example, in the above embodiments, a GaN substrate whose (0001) plane is exposed at the surface is used to form the nitride-based semiconductor layers on the (0001) plane and form an n-side electrode on the (000–1) plane that is the rear surface of the substrate; however, a GaN substrate having a different plane direction may be used. For example, a GaN substrate whose m plane is exposed at the surface may be used to form the n-side electrode on the (1–100) plane that is the rear surface.

Furthermore, for example, although the above embodiments have provided descriptions of a semiconductor laser element whose oscillation wavelength is 405 nm, the present disclosure is applicable also to a semiconductor laser element whose oscillation wavelength is at least 365 nm and at most 540 nm by changing the configuration of the light emission layer (the composition ratio of In, for example) etc.

For example, by setting input current to approximately at least 2 A and at most 10 A, and setting input voltage to approximately at least 3.5 V and at most 6 V for a semiconductor laser element whose ridge width (stripe width) is approximately at least 8 µm and at most 100 µm and whose resonator length is approximately at least 800 µm and at most 5000 µm, it is possible to realize a semiconductor laser element having optical characteristics for emitting laser light having a wavelength band of approximately at least 365 nm and at most 390 nm and having light output of approximately at least 1 W and at most 5 W.

For example, by setting input current to approximately at least 2 A and at most 10 A, and setting input voltage to approximately at least 4 V and at most 6 V for a semiconductor laser element whose ridge width (stripe width) is approximately at least 30 µm and at most 100 µm and whose resonator length is approximately at least 1200 µm and at most 5000 µm, it is possible to realize a semiconductor laser element having optical characteristics for emitting laser light having a wavelength band of approximately at least 390 nm and at most 420 nm and having light output of approximately at least 3 W and at most 10 W.

For example, by setting input current to approximately at least 4 A and at most 15 A, and setting input voltage to approximately at least 4 V and at most 7 V for a semiconductor laser element whose ridge width (stripe width) is approximately at least 50 µm and at most 150 µm and whose resonator length is approximately at least 1300 µm and at most 5000 µm, it is possible to realize a semiconductor laser element having optical characteristics for emitting laser light having a wavelength band of approximately at least 420 nm and at most 460 nm and having light output of approximately at least 6 W and at most 15 W.

For example, by setting input current to approximately at least 4 A and at most 15 A, and setting input voltage to approximately at least 4 V and at most 7 V for a semiconductor laser element whose ridge width (stripe width) is approximately at least 30 µm and at most 150 µm and whose resonator length is approximately at least 1200 µm and at most 5000 µm, it is possible to realize a semiconductor laser element having optical characteristics for emitting laser light having a wavelength band of approximately at least 460 nm and at most 500 nm and having light output of approximately at least 3 W and at most 15 W.

For example, by setting input current to approximately at least 4 A and at most 15 A, and setting input voltage to approximately at least 4.5 V and at most 7 V for a semiconductor laser element whose ridge width (stripe width) is approximately at least 40 µm and at most 150 µm and whose resonator length is approximately at least 1300 µm and at most 5000 µm, it is possible to realize a semiconductor laser element having optical characteristics for emitting laser light having a wavelength band of approximately at least 500 nm and at most 540 nm and having light output of approximately at least 2 W and at most 10 W.

For example, each of the above semiconductor laser elements may be a multiple-emitter semiconductor laser element having a plurality of (for example, approximately 60) stripes that are current-constricted in stripes.

For example, although the above embodiments each have illustrated a nitride-based semiconductor light-emitting element as an example of the nitride-based semiconductor device, the nitride-based semiconductor device may be a light-receiving element such as a photodiode. Alternatively, the nitride-based semiconductor device may be an amplifying element or a switching element such as a bipolar transistor or a field-effect transistor (FET).

For example, although the p-type nitride-based semiconductor layers (a p-type nitride-based semiconductor crystal) in the above embodiments are formed using metalorganic vapor-phase epitaxy, it is also possible to use hydride vapor phase epitaxy (including halide vapor phase epitaxy in which hydrogen is used) or molecular beam epitaxy in which a nitrogen compound containing hydrogen such as ammonia is used as a material for nitrogen.

Various changes, substitutions, additions, omissions, and so on, can be carried out in each of the above embodiments within the scope of the claims or its equivalents.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be used as a reliable nitride-based semiconductor light-emitting element and a manufacturing method thereof and a manufacturing method of a reliable nitride-based semiconductor device, and can be used for a laser device, an illumination device, and a display device, for example.

The invention claimed is:

1. A manufacturing method of a nitride-based semiconductor light-emitting element, the manufacturing method comprising:
   forming an n-type nitride-based semiconductor layer;
   forming, on the n-type nitride-based semiconductor layer, a light emission layer including a nitride-based semiconductor;
   forming, on the light emission layer in an atmosphere containing a hydrogen gas, a p-type nitride-based semiconductor layer while doping the p-type nitride-based semiconductor layer with a p-type dopant at a concentration of at least $2.0 \times 10^{18}$ atom/cm$^3$; and
   annealing the p-type nitride-based semiconductor layer at a temperature of at least 800 degrees Celsius in an atmosphere not containing hydrogen,
   wherein a hydrogen concentration of the p-type nitride-based semiconductor layer after the annealing is at most $5.0 \times 10^{18}$ atom/cm$^3$ and at most 5% of the concentration of the p-type dopant, and
   a hydrogen concentration of the light emission layer is at most $2.0 \times 10^{17}$ atom/cm$^3$.

2. The manufacturing method according to claim 1, wherein the annealing includes:
   first annealing of annealing the p-type nitride-based semiconductor layer at a temperature of at least 800 degrees Celsius in an inert gas atmosphere; and second annealing of annealing the p-type nitride-based semiconductor layer at a temperature of at most 800 degrees Celsius in an oxidizing gas atmosphere after the first annealing.

3. The manufacturing method according to claim 2, further comprising:
forming a ridge by removing part of the p-type nitride-based semiconductor layer,
wherein the forming of the ridge is performed after the first annealing, before the second annealing.

4. The manufacturing method according to claim 1, further comprising:
forming, on the p-type nitride-based semiconductor layer, an oxide selected from a group consisting of tantalum, vanadium, tin, indium, molybdenum, tungsten, niobium, titanium, cobalt, manganese, yttrium, and silicon.

5. The manufacturing method according to claim 1, further comprising:
setting an oxygen concentration of the p-type nitride-based semiconductor layer higher than an oxygen concentration of the light emission layer.

6. The manufacturing method according to claim 1, wherein
the p-type nitride-based semiconductor layer contains aluminum.

7. The manufacturing method according to claim 1, wherein
the light emission layer contains indium.

8. The manufacturing method according to claim 1, further comprising:
forming an undoped nitride-based semiconductor layer provided between the light emission layer and the p-type nitride-based semiconductor layer.

9. The manufacturing method according to claim 4, wherein
the oxide is an electrically-conductive translucent material.

10. The manufacturing method according to claim 2, wherein
the oxidizing gas atmosphere is an atmosphere containing an oxygen gas.

11. The manufacturing method according to claim 2, further comprising:
forming a ridge by removing part of the p-type nitride-based semiconductor layer,
wherein the first annealing and the second annealing are performed after the forming of the ridge.

12. A manufacturing method of a nitride-based semiconductor light-emitting element, the manufacturing method comprising:
forming an n-type nitride-based semiconductor layer;
forming, on the n-type nitride-based semiconductor layer, a light emission layer including a nitride-based semiconductor;
forming, on the light emission layer, a p-type nitride-based semiconductor layer while doping the p-type nitride-based semiconductor layer with a p-type dopant at a concentration of at least $2.0 \times 10^{18}$ atom/cm$^3$; and
annealing the p-type nitride-based semiconductor layer at a temperature of at least 800 degrees Celsius in an atmosphere not containing hydrogen,
wherein a hydrogen concentration of the p-type nitride-based semiconductor layer after the annealing is at most $5.0 \times 10^{18}$ atom/cm$^3$ and at most 5% of the concentration of the p-type dopant,
a hydrogen concentration of the light emission layer is at most $2.0 \times 10^{17}$ atom/cm$^3$, and the annealing includes:
first annealing of annealing the p-type nitride-based semiconductor layer at a temperature of at least 800 degrees Celsius in an inert gas atmosphere; and
second annealing of annealing the p-type nitride-based semiconductor layer at a temperature of at most 800 degrees Celsius in an oxidizing gas atmosphere after the first annealing.

13. The manufacturing method according to claim 12, further comprising:
setting an oxygen concentration of the p-type nitride-based semiconductor layer higher than an oxygen concentration of the light emission layer.

14. The manufacturing method according to claim 12, further comprising:
forming a ridge by removing part of the p-type nitride-based semiconductor layer,
wherein the forming of the ridge is performed after the first annealing, before the second annealing.

15. The manufacturing method according to claim 12, further comprising:
forming, on the p-type nitride-based semiconductor layer, an oxide selected from a group consisting of tantalum, vanadium, tin, indium, molybdenum, tungsten, niobium, titanium, cobalt, manganese, yttrium, and silicon.

16. The manufacturing method according to claim 12, wherein
the p-type nitride-based semiconductor layer contains aluminum.

17. The manufacturing method according to claim 12, wherein
the oxidizing gas atmosphere is an atmosphere containing an oxygen gas.

18. The manufacturing method according to claim 12, further comprising:
forming a ridge by removing part of the p-type nitride-based semiconductor layer,
wherein the first annealing and the second annealing are performed after the forming of the ridge.

19. A manufacturing method of a nitride-based semiconductor crystal, the manufacturing method comprising:
forming, in an atmosphere containing a hydrogen gas, a p-type nitride-based semiconductor crystal while doping the p-type nitride-based semiconductor layer with a p-type dopant at a concentration of at least $2.0 \times 10^{18}$ atom/cm$^3$;
first annealing of annealing the p-type nitride-based semiconductor crystal at a temperature of at least 800 degrees Celsius in an inert gas atmosphere; and
second annealing of annealing the p-type nitride-based semiconductor crystal at a temperature of at most 800 degrees Celsius in an oxidizing gas atmosphere after the first annealing,
wherein a hydrogen concentration of the p-type nitride-based semiconductor crystal after the second annealing is at most $5.0 \times 10^{18}$ atom/cm$^3$ and at most 5% of the concentration of the p-type dopant.

20. The manufacturing method according to claim 19, wherein
the oxidizing gas atmosphere is an atmosphere containing an oxygen gas.

21. The manufacturing method according to claim 19, wherein the forming of the p-type nitride-based semiconductor crystal is performed by metalorganic vapor-phase epitaxy.

22. The manufacturing method according to claim 19, wherein the p-type nitride-based semiconductor crystal contains aluminum.

\* \* \* \* \*